(12) United States Patent
Tsuchiya et al.

(10) Patent No.: US 8,409,936 B2
(45) Date of Patent: Apr. 2, 2013

(54) METHOD FOR MANUFACTURING A SEMICONDUCTOR DEVICE BY FORMING PORTIONS THEREOF AT THE SAME TIME

(75) Inventors: Ryuta Tsuchiya, Tokyo (JP); Shinichiro Kimura, Kunitachi (JP)

(73) Assignee: Renesas Electronics Corporation, Kawasaki-shi (JP)

(*) Notice: Subject to any disclaimer, the term of this patent is extended or adjusted under 35 U.S.C. 154(b) by 0 days.

(21) Appl. No.: 13/363,268

(22) Filed: Jan. 31, 2012

(65) Prior Publication Data

US 2012/0196411 A1 Aug. 2, 2012

Related U.S. Application Data

(63) Continuation of application No. 11/993,862, filed as application No. PCT/JP2006/313060 on Jun. 30, 2006, now abandoned.

(30) Foreign Application Priority Data

Jul. 5, 2005 (JP) ................................. 2005-195748

(51) Int. Cl.
*H01L 21/84* (2006.01)

(52) U.S. Cl. ........ 438/151; 438/154; 438/197; 257/347; 257/E27.112

(58) Field of Classification Search ................... 257/347, 257/E27.112; 438/128, 151, 154, 197, 296
See application file for complete search history.

(56) References Cited

U.S. PATENT DOCUMENTS

| | | |
|---|---|---|
| 5,631,179 A | 5/1997 | Sung et al. |
| 6,043,536 A | 3/2000 | Numata et al. |
| 6,215,155 B1 | 4/2001 | Wollenson |
| 6,221,732 B1 | 4/2001 | Kaneko |
| 6,380,037 B1 | 4/2002 | Osanai |
| 6,746,943 B2 * | 6/2004 | Takayanagi et al. .......... 438/587 |
| 2003/0153172 A1 | 8/2003 | Yajima et al. |

FOREIGN PATENT DOCUMENTS

| | | |
|---|---|---|
| JP | 62179143 A | 8/1987 |
| JP | 5-343686 A | 12/1993 |
| JP | 8-102498 A | 4/1996 |
| JP | 9-223802 A | 8/1997 |
| JP | 11-238854 A | 8/1999 |
| JP | 2000-208770 A | 7/2000 |
| JP | 2000-252462 A | 9/2000 |
| JP | 2001-007196 A | 1/2001 |
| JP | 2001-527293 A | 12/2001 |
| JP | 2003-110109 A | 4/2003 |

OTHER PUBLICATIONS

Office Action from Japanese Patent Application No. 2007-524011 (and English translation).
T. Mizuno et al., "Performance Fluctuations of 0.10 μm MOSFETs—Limitation of 0.1 μm ULSIs," 1994 Symposium on VLSI Technology Digest of Technical Papers, 1994, p. 13-14.
T. Yamada et al., "An Embedded DRAM Technology on SOI/Bulk Hybrid Substrate Formed with SEG Process for High-End SOC Application," 2002 Symposium on VLSI Technology Digest of Technical Papers, 2002, pp. 112-113.

* cited by examiner

*Primary Examiner* — Robert Huber
(74) *Attorney, Agent, or Firm* — Miles & Stockbridge P.C.

(57) ABSTRACT

A device and a method for manufacturing the same in which with device includes a single crystal semiconductor substrate and an SOI substrate separated from the single crystal semiconductor substrate by a thin buried insulating film and having a thin single crystal semiconductor thin film (SOI layer) in which well diffusion layer regions, drain regions, gate insulating films, and gate electrodes of the SOI-type MISFET and the bulk-type MISFET are formed in the same steps. The bulk-type MISFET and the SOI-type MISFET are formed on the same substrate, so that board area is reduced and a simple process can be realized by making manufacturing steps of the SOI-type MISFET and the bulk-type MISFET common.

8 Claims, 15 Drawing Sheets

METHOD FOR MANUFACTURING A SEMICONDUCTOR DEVICE BY FORMING PORTIONS THEREOF AT THE SAME TIME

CROSS-REFERENCE TO RELATED APPLICATION

This application is a continuation of application Ser. No. 11/993,862 filed Dec. 23, 2007, which is a 371 of PCT/JP2006/313060 filed Jun. 30, 2006.

TECHNICAL FIELD

The present invention relates to an MISFET having a stacked structure of semiconductor/insulating film/metal, and more specifically it relates to a semiconductor device in which an MISFET is formed on a substrate having an SOI (Silicon on Insulator) structure and a method for manufacturing the same.

BACKGROUND ART

Recently, as high integration and high performance of LSIs have progressed, miniaturization of MISFET (Metal/Insulator/Semiconductor Field Effect Transistor) is advanced and its gate length is scaled, so that a problem of the short-channel effect which lowers a threshold voltage Vth has become significant. The short-channel effect is caused by the fact that a spread of a depletion layer in source and drain portions of the MISFET influences a channel portion according to miniaturization of the channel length. Increasing impurity concentration in the channel portion to suppress the spread of the depletion layer in the source and drain portions is one of methods for suppressing the influence. But if the impurity concentration in the channel portion is increased, degradation of drive current becomes problematic depending on carrier mobility resulting from increase of impurity scattering. Further, if the impurity concentration is increased, parasitic capacitances among the substrate, the source, and the drain are increased and thus fast operation of the MISFET is hampered.

Further, conventionally, the threshold voltage Vth of the MISFET is controlled by the impurity concentration of a channel region. Impurity concentration control of channel is relatively well performed up to an LSI of the design rule of about 100 nm node by using an ion implantation technique and a short heat treatment technique.

As to an MISFET of the design rule of 100 nm node or subsequent thereto, however, since an absolute number of impurities contributing to the threshold voltage Vth of MISFET per one is reduced along with the channel length shortened by the method of controlling the threshold voltage Vth by an impurity amount in the channel, variation of the threshold voltage Vth caused by statistical fluctuation cannot be ignored (for example, see Non-Patent Document 1). Therefore, it has been longed to make it possible to control the threshold value Vth of the MISFET according to a work function of a gate electrode as well by the impurity concentration control of a channel portion and another method as a miniaturized device-matching process.

In order to solve such a problem, in recent years, SOI structure has attracted attentions. In this structure, complete device isolation is made by an insulating film (for example, silicon oxide film), and so soft error and latch up are suppressed, so that high reliability is gained even in a highly-integrated LSI, and moreover, since junction capacitance of a diffusion layer is reduced, charge and discharge resulting from switching are reduced and so it is advantageous for achieving high speed and low power consumption.

The SOI type MISFETs are roughly classified to two operation modes. One of these is a Full Depletion SOI in which a depletion layer induced in a body region beneath a gate electrode reaches a bottom surface of the body region, namely, an interfacial surface between the body region and an buried oxide film, and the other is a Partial Depletion SOI in which the depletion layer does not reach the bottom surface of the body region and there remains a neutral region.

In the full depletion type SOI-MISFET, since the thickness of the depletion layer just below the gate is limited by the buried oxide film, a depletion charge amount is considerably reduced as compared to the partial depletion SOI-MISFET, and instead, mobile charges contributing to a drain current are increased. As a result, there is an advantage that a steep sub-threshold characteristic (S characteristic) can be obtained.

In other words, when a steep S characteristic is obtained, the threshold voltage Vth can be lowered while suppressing off-leakage current. As a result, a drain current is secured even at a low operating voltage, so that it becomes possible to manufacture a MISFET with extremely low power consumption such as a MISFET operating at 1V or lower (the threshold voltage Vth is also 0.3 V or lower).

Further, generally, in a case of a MISFET manufactured on a substrate, there is the abovementioned problem of short-channel effect. Meanwhile, in a case of the full depletion type SOI-MISFET, since the substrate and the device are isolated from each other by an oxide film and the depletion layer will not spread, a substrate concentration can be lowered in the full depletion type SOI-MISFET. Therefore, since lowering of carrier mobility along with increase of impurity scattering is suppressed, high drive current can be achieved. Further, as compared to the method of controlling the threshold voltage Vth by impurity concentration, variation of the threshold voltage Vth caused by statistical fluctuation of the number of impurities with respect to one MISFET can be reduced.

On the other hand, a double-gate MISFET structure has been known as another conventional technique relating to the SOI-MISFET, which has been proposed in Patent Document 1, for example. In the above SOI-MISFET, after a source diffusion layer and a drain diffusion layer are formed in an SOI layer according to self-alignment with a dummy gate electrode, formation of a reverse pattern groove of the dummy gate electrode and formation of a buried gate according to ion implantation of impurities from the groove to a supporting substrate are performed sequentially, thereafter, a metal film such as W (tungsten) is selectively buried in the groove region, thereby an upper gate electrode is made. Realization of the double-gate structure is potential means as means for improving SOI-MISFET performance, but in the double-gate MISFET structure based on presently well-known means, it is extremely difficult to form a high-concentration diffusion layer or the like in a buried manner in the supporting substrate without adversely affecting the SOI layer, and thus the double-gate MISFET structure has not reached practical use yet. When difficulty in manufacture is ignored and an essential concept of the double-gate MISFET structure is taken into account, it is a premise that a buried gate and an upper gate are aligned accurately, and it is necessarily required to arrange the buried gate for each individual device. Such a concept of sharing the role of the buried gate electrode by a plurality of MISFETs does not basically exist. Alignment error of the buried gate is fatal in an ultrafine SOI-MISFET and directly leads to variation of parasitic capacitance and variation of drive current. Therefore, even if the parasitic capacitor is effectively utilized for stabilization of a dynamic operation, utilization of the parasitic capacitor for stabilization is also irrealizable unless capacitance variation is suppressed essentially. Further, since the threshold voltage of the double-gate structure SOI-MISFET is determined only by a work function of each material for the upper gate and the buried gate except for a component of SOI layer film thickness, it is substantially impossible to set a threshold voltage value for each desired MISFET. It is a premise that a connection between the buried gate electrode and the upper gate electrode is made outside an MISFET active region, namely, in a device isolation region, and consistency with a consideration of peripheral device layout is essential.

Herein, in the above full depletion type SOI-MISFET manufactured by using an SOI substrate with a buried insulating film having a thickness of 50 nm or less, more preferably 10 nm or less, and a thin single crystal semiconductor thin film having a thickness of 20 nm or less, by applying a gate potential to a well diffusion layer just below the SOI-MISFET, a conduction state of the SOI-MISFET is further accelerated due to a high-potential application of a well potential via the thin buried insulating film, which causes significant increase of drive current, namely, achieves high current. When the gate potential is applied as a low potential, the well potential is lowered in a following manner, so that a non-conduction state can be achieved faster. That is, a characteristic of further increasing drive current under the same condition of leakage current can be realized in the above operation mode, so that it becomes possible to perform switching between conduction and non-conduction at a higher speed. Isolation for insulation on sidewalls of a well diffusion layer contributes to reduction of a parasitic capacitance, namely, reduction of a delay time constant of an application signal. Further, the thinner the buried insulating film is, the more effective for improvement of an increase effect of the drive current, and ideally, a film thickness condition equivalent to that of the gate insulating film of the SOI-MISFET is preferable. As described above, by applying the thin buried insulating film to the SOI-MISFET, a characteristic of essential performance improvement of the SOI-MISFET according to the double-gate structure can be utilized. Further, since the well diffusion layer just below the SOI-MISFET is formed in a self-aligned manner under the gate electrode, the problems of drive current variation and parasitic capacitance variation caused by an alignment error of the buried gate electrode, which are problematic in a conventional double-gate MISFET structure, can be essentially removed.

As described above, the SOI-type MISFET has such an excellent feature as low power consumption and high speed.

Patent Document 1: Japanese Patent Application Laid-Open Publication No. 2000-208770

Non-Patent Document 1: T. Mizuno et al. "Performance Fluctuations of 0.10 µm MOSFETs—Limitation of 0.10µ ULSIs", Symp. On VLSI Technology 1994

Non-Patent Document 2: T. Yamada et al. "An Embedded DRAM Technology on SOI/Bulk Hybrid Substrate Formed with SEG Process for High-End SOC Application" Symp. On VLSI Technology 2002

DISCLOSURE OF THE INVENTION

Meanwhile, the above-said SOI-type MISFET has the following problems. Generally, an MISFET manufactured on an SOI substrate can be used only in a low voltage region, since a source-drain withstand voltage is deteriorated. It is difficult to form a device of a high withstand voltage system, an ESD protection device for preventing ESD breakdown (electrostatic breakdown), and the like on the SOI substrate. Therefore, in a region used at a high withstand voltage, not an SOI substrate but a bulk substrate is used. In this manner, when a bulk silicon substrate and an SOI substrate are used, two substrates are required, so that a board area cannot be made small, and therefore the whole semiconductor device cannot be made small. Moreover, when an SOI-type MISFET and a bulk-type MISFET are tried to be manufactured on the same substrate, selective epitaxial growth technique is required, and it is required to manufacture an SOI-type MISFET and a bulk-type MISFET in different steps, for example as shown in Non-Patent Document 2, which results in such a problem that the process becomes complex.

The present invention has been made in view of the above conventional problems, and an object thereof is to provide a semiconductor device the whole of which can be reduced in size even if the semiconductor device is a semiconductor device in which both an SOI-type MISFET used as a lower voltage region and a bulk-type MISFET used as a high voltage region are present, and which can be manufactured without a complicating process, and a method for manufacturing the same.

In an example of a typical one of the present inventions, it is premised that an SOI substrate formed of a single crystal semiconductor substrate and a thin single crystal semiconductor thin film (SOI layer) separated from the single crystal semiconductor by a thin buried insulating film is used. Premising an application to an ultrafine full depletion SOIMISFET, where the gate length thereof is 100 nm or less, more preferably 50 nm or less, a thickness of the buried insulating film is 10 nm or less and a thickness of the thin single crystal semiconductor thin film is 20 nm or less, and preferably an SOI substrate having a thickness of about 10 nm is used.

More specifically, in a semiconductor device having a sheet of substrate, the substrate includes a first device formation region and a second device formation region. Moreover, in the first device formation region, a first semiconductor substrate portion of a first conductive type, a semiconductor layer formed above the first semiconductor substrate portion via an insulating layer, a first source region and a first drain region of a second conductive type formed in the semiconductor layer, a first channel region formed between the first source region and the first drain region, a first gate insulating film formed on the first channel region, and a first gate electrode formed above the first channel region via the first gate insulating film are formed. Further, in the second device formation region, a second semiconductor substrate portion of the first conductive type, a second source region and a second drain region formed in the second semiconductor substrate portion, a second channel region formed between the second source region and the second drain region, a second gate insulating film formed on the second channel region, and a second gate electrode formed above the second channel region via the second gate insulating film are formed. Moreover, a thickness of the insulating layer is 20 nm or less, and a thickness of the semiconductor layer is 20 nm or less. Herein, the insulating layer corresponds to a thin buried insulating film, the semiconductor layer corresponds to a thin single crystal semiconductor thin film, and a step generated between the first device formation region and the second device formation region is as small as 30 nm or less. Therefore, the first and second source regions, the first and second drain regions, the first and second gate insulating film, and the first and second gate electrodes can be respectively formed at the same step. In other words, it becomes possible to make processes to form the SOI-MOSFET on the first device formation region and the bulk-MOS- FET on the second device formation region simultaneously with a common process, without forming them in different steps, respectively.

According to the invention according to the above-described means, since the device of a high withstand voltage system and the ESD protection device for preventing ESD breakdown (electrostatic breakdown) are formed as a bulk-MISFET on the same substrate, the board area can be made smaller as compared to a case where an SOI-type MISFET which is excellent in low power consumption and high speed and a bulk-type MISFET are formed on different substrates and are connected with each other. Moreover, steps for manufacturing the SOI-type MISFET and the bulk-type MISFET are made common, so that manufacture of both the devices can be realized without complicating the process.

BRIEF DESCRIPTIONS OF THE DRAWINGS

BEST MODE FOR CARRYING OUT THE INVENTION

In the following embodiments, explanation will be given separately in a plurality of sections or embodiments when needed for the sake of convenience. However, unless otherwise stated, they are not irrelevant to each other, but are in the relation that one of them is a modification example, detail, supplemental explanation and so on of a part or the entirety of the other part.

Moreover, in the following embodiments, when the numbers of elements and the like (including the number of the items, numerical value, amount, range, etc.) are mentioned, they are not limited to the particular numbers unless otherwise stated and it is obviously limited to particular numbers in principle. The number larger or smaller than the specified number is also applicable.

Further, in the following embodiments, components (including composing steps) are not always indispensable unless particularly stated and apparently indispensable in principle.

Similarly, in the following embodiments, shapes and positions of components include substantially approximate or similar ones unless otherwise stated and deemed to be apparently against the principle.

Note that components having the same function are denoted by the same reference symbols throughout the drawings for describing the embodiment, and the repetitive description thereof will be omitted.

Hereinafter, embodiments of the present invention will be described in detail with reference to the accompanying drawings. Materials, conductive types, and manufacturing conditions of the respective parts are not limited to the description of the embodiments and it is needless to say that various modifications can be made respectively.

First Embodiment

Figure 1:
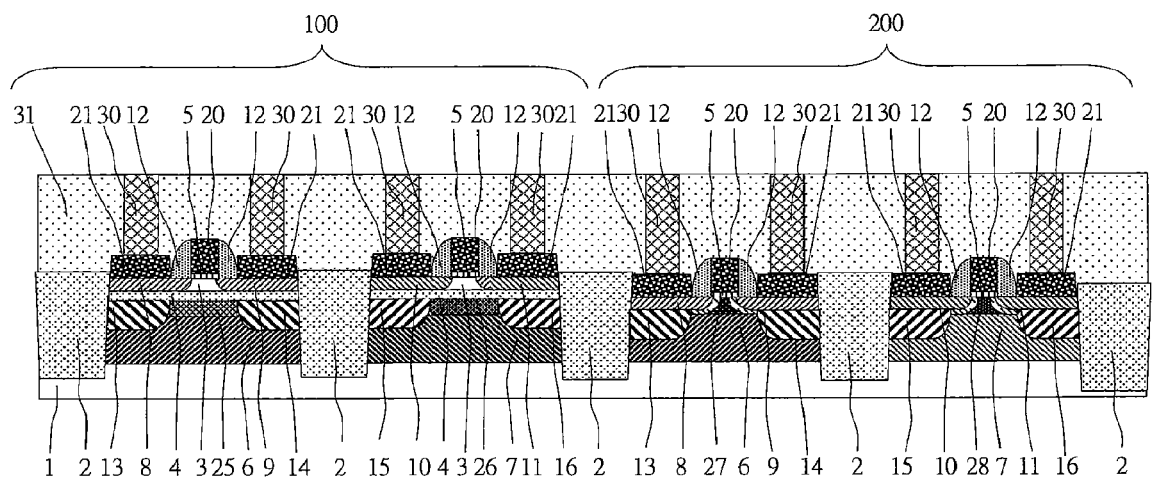
FIG. 1 is a sectional view of a completed MISFET according to a first embodiment of the present invention.
Figure 2:
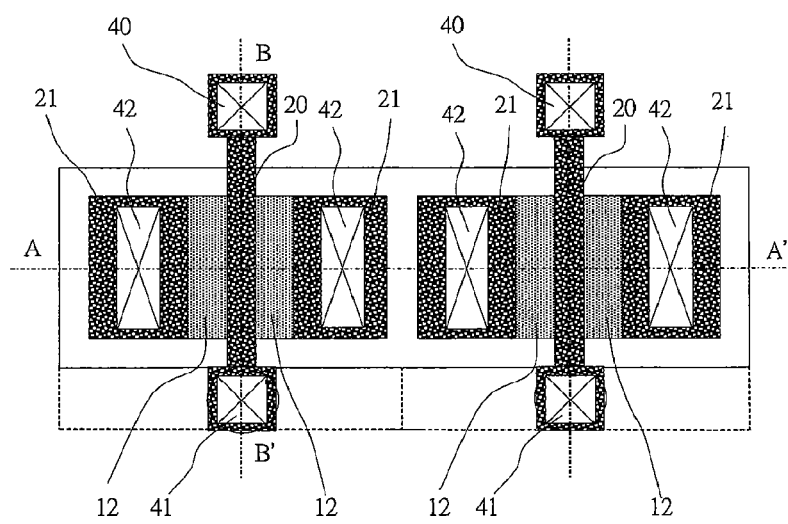
FIG. 2 is a plan view showing a semiconductor device according to the first embodiment of the present invention.
Figure 3:
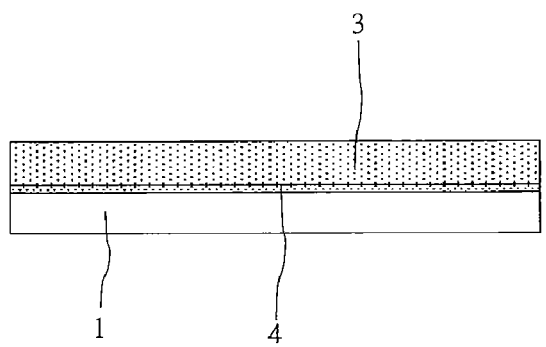
FIG. 3 is a diagram for describing a manufacturing step of the MISFET according to the first embodiment.

FIG. 1 is a sectional view showing a completed MISFET according to a first embodiment of the present invention. Manufacturing steps thereof will be described with reference to FIG. 2 and subsequent figures. For convenience of description, description will be made with conductive types of a semiconductor substrate and a semiconductor film being fixed, but the combination of conductive types may be arbitrary, so the conductive type is not limited to the ones described in the present embodiment. A first semiconductor substrate is made by a semiconductor substrate 1 made of single crystal Si having a plane orientation of (100), P conductive type, a resistivity of 10 ohm·cm and a diameter of 20 cm, a main surface thereof has been subjected to mirror polishing, and a thermal oxide film 4 made of silicon having a thickness of 10 nm is formed thereon. Hydrogen ion implantation is performed to the first semiconductor substrate based on a well-known method of manufacturing an ultra-thin film SOI substrate. The implantation dose was $5\times10^{16}/cm^2$. As a result of the ion implantation, a crystal defect layer 3 is formed at a depth of about 40 nm from the main surface of single crystal Si substrate. From this state, after hydrophilic treatment is applied to each of second semiconductor substrates having the same specification of the first semiconductor substrate without a silicon oxide film on its surface, the main surfaces of both the substrates are adhered with each other at room temperature. Next, although the two Si substrates adhered with each other are heated to 500° C., formation of micro-holes and enlargement thereof occur in a crystal defective layer due to the heat treatment, so that the single crystal Si substrate is delaminated at a crystal defective layer portion. And, a thermal silicon oxide film 2 having a thickness of 10 nm is adhered with the supporting substrate 1 and a single-crystal Si thin film 3 having a thickness of about 20 nm is adhered thereon. In this state, by performing a high temperature heat treatment of 1100° C., adhesive strength between a thermal silicon oxide film 4 and the supporting substrate 1 is dramatically improved, where adhesive strength equivalent to an ordinal single crystal substrate is obtained. From this state, a surface of the single crystal Si thin film 3, namely, delamination surface is subjected to mirror polishing by a surface polishing method which does not contain abrasive grain, and a thin buried gate insulating film 4 is sequentially formed at a lower portion of the single crystal Si thin film 3 on the supporting substrate 1, so that an SOI substrate is manufactured. The above-described SOI substrate is not necessary to be manufactured according to the above method, and there is no problem if it is according to purchase of a commercially-available substrate with a similar specification. At that time, after forming a silicon oxide film on the SOI substrate, a Si layer is thinned to a desired single crystal Si layer by removing the silicon oxide film and used.

Figure 4:
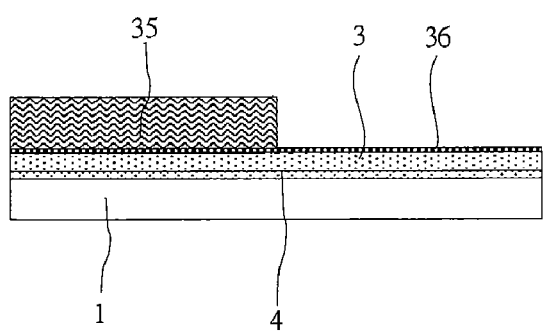
FIG. 4 is a diagram for describing a manufacturing step of the MISFET according to the first embodiment.
Figure 5:
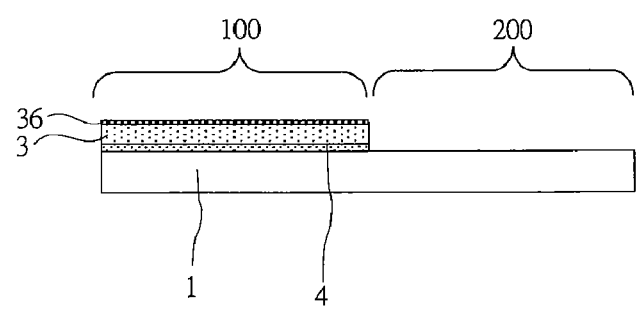
FIG. 5 is a diagram for describing a manufacturing step of the MISFET according to the first embodiment.

On the above SOI substrate, a silicon oxide film 36 is formed having a thickness of 10 nm, a resist mask 35 is applied thereon thereafter, and the resist mask is removed only in a region 200 where a bulk-type MISFET should be formed (FIG. 4). In the state in FIG. 4, the silicon oxide film 36, the single crystal Si layer 3, and the thin buried insulating film 4 are removed to expose a surface of the supporting substrate. Thereafter, the resist mask 35 is removed (FIG. 5). According to the above steps, regions 100 and 200 in which the SOI-type MISFET and the bulk-type MISFET should be formed are formed, respectively. Steps subsequent to the above steps will be described by respectively illustrating the formation region 100 for the SOI-type MISFET and the formation region 200 for the bulk-type MISFET separately for convenience of description.

Figure 6:
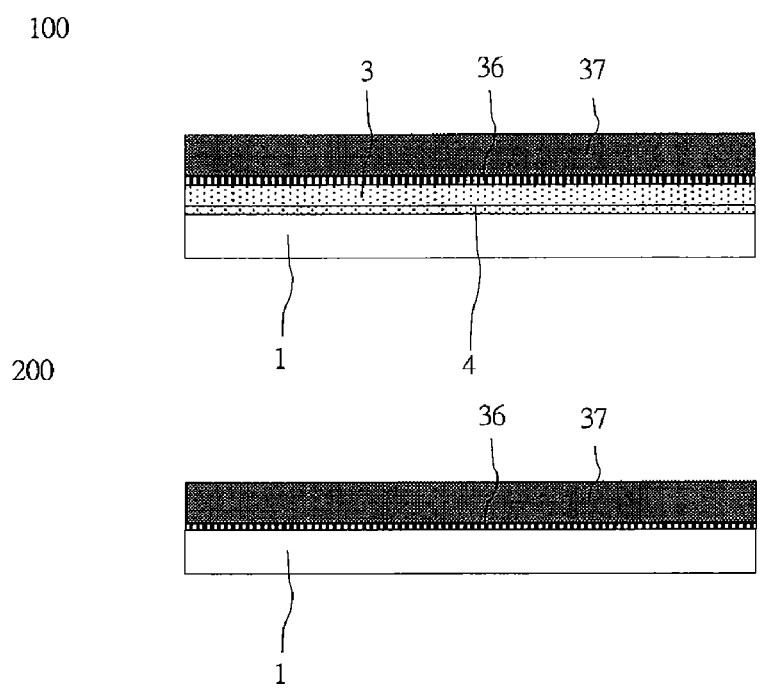
FIG. 6 is a diagram for describing a manufacturing step of the MISFET according to the first embodiment.
Figure 7:
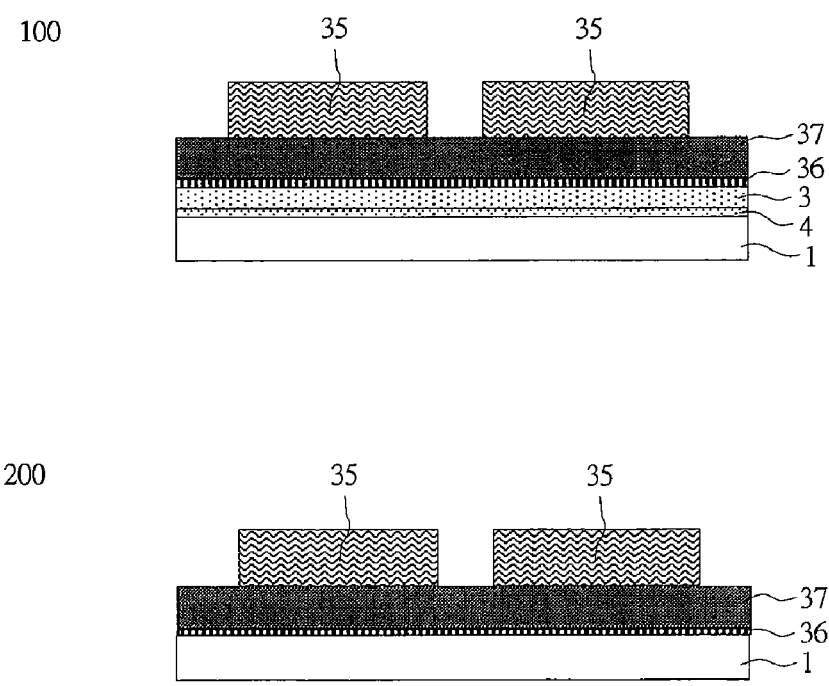
FIG. 7 is a diagram for describing a manufacturing step of the MISFET according to the first embodiment.
Figure 8:
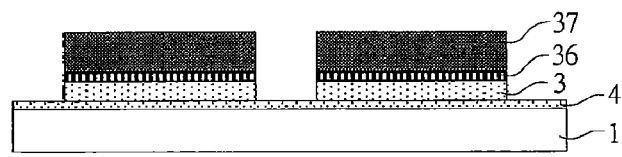
FIG. 8 is a diagram for describing a manufacturing step of the MISFET according to the first embodiment.
Figure 8:
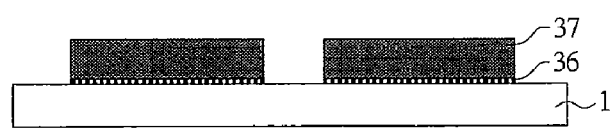
Figure 9:
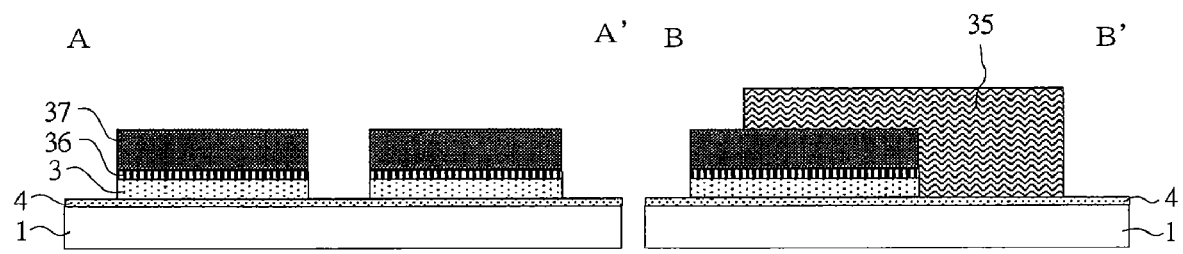
FIG. 9 is a diagram for describing a manufacturing step of the MISFET according to the first embodiment.
Figure 9:
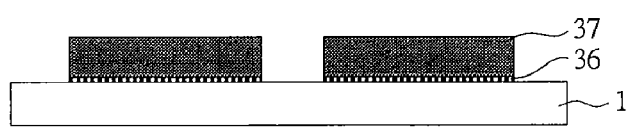

From the state of FIG. 5, a silicon oxide film 36 and a silicon nitride film 37 are formed (FIG. 6). The silicon nitride film formed here is used as a polishing stopper during chemical-mechanical polishing in a later formation of a shallow trench device isolation. Note that, one point according to the present invention lies in that the film thickness of the silicon nitride film is made larger than the thickness obtained by adding the film thickness of the single crystal Si thin film 3 and the thickness of the thermal silicon oxide film 4 in the formation region 100 of the SOI-type MISFET. In other words, the film thickness of the silicon nitride film is made larger than a step between the surface of the single crystal Si thin film 3 in the formation region 100 of the SOI-type MISFET and the surface of the semiconductor substrate 1 in the formation region 200 of the bulk-type MISFET. An operational advantage relating to this feature will be described later. Next, after the resist mask 35 is applied, only the resist mask in a desired region is removed (FIG. 7). Thereafter, the silicon nitride film 37 and the silicon oxide film 36 in a desired region and the single crystal Si layer 3 are removed (FIG. 8). Note that, a resist mask between devices configuring a pair of complementary MISFETs is removed after such patterning that the devices are disposed on the same well diffusion layer. From the state of FIG. 8, after the resist mask 35 is applied, the resist mask in a desired region is removed (FIG. 9). Next, the buried oxide film 4 in a desired region and the Si layer of the supporting substrate 1 are removed by 200 nm to form a region for forming a contact between a gate and a well on a device isolation region serving as an STI (Shallow Trench Isolation) and the SOI-type MISFET formation region (FIG. 10).

Figure 10:
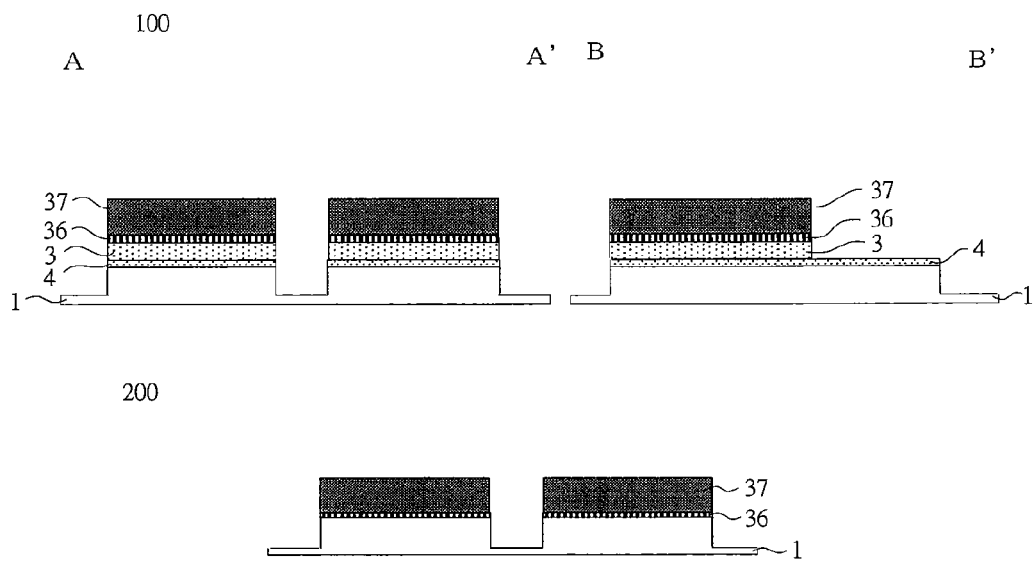
FIG. 10 is a diagram for describing a manufacturing step of the MISFET according to the first embodiment.
Figure 11:
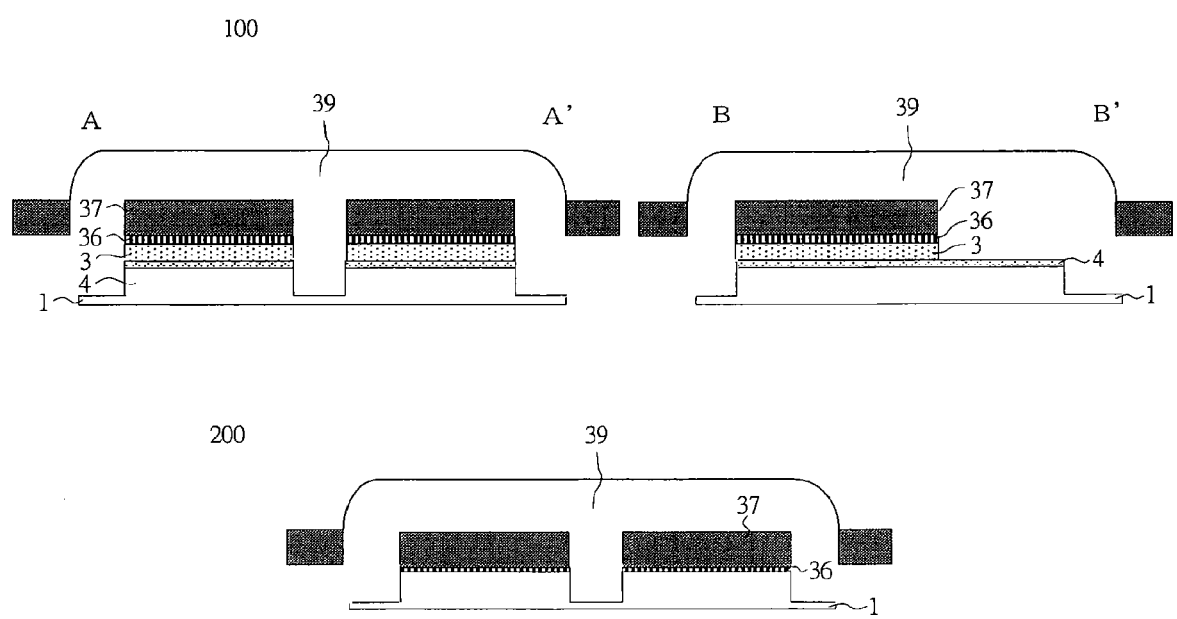
FIG. 11 is a diagram for describing a manufacturing step of the MISFET according to the first embodiment.
Figure 12:
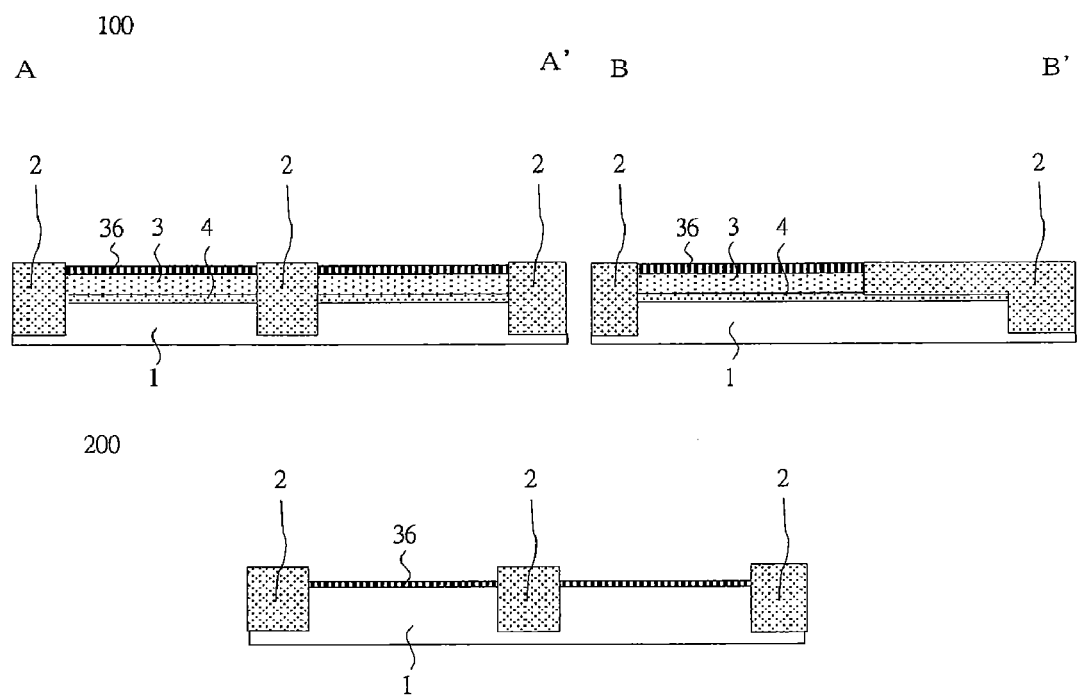
FIG. 12 is a diagram for describing a manufacturing step of the MISFET according to the first embodiment.

From the state of FIG. 10, formation of a thin thermal oxide film in an exposed Si region and an overall deposition of a thick silicon oxide film 39 having a film thickness sufficient to bury a patterning region are performed according to a well-known method for forming a device isolation insulating film (FIG. 11). Subsequently, a thick silicon oxide film exposed by selectively removing a silicon nitride film positioned on a region where the silicon nitride film has been selectively left by the deposition of the silicon nitride film and the previous patterning and a silicon nitride film positioned from the region up to a certain distance is removed by chemical-mechanical polishing. Terminal points of the polishing are the silicon nitride film deposited previously and the silicon nitride film 37 left on the pattern. Subsequently, the silicon nitride film 37 and the like are selectively removed by hot phosphoric acid (FIG. 12). At this step, the above-said point relating to the film thickness of the silicon nitride film 37 functions effectively. That is, when the film thickness of the silicon nitride film 37 is set to be equal to or smaller than a step between the surface of the single crystal Si thin film 3 in the formation region 100 of the SOI-type MISFET and the surface of the semiconductor substrate 1 in the formation region 200 of the bulk-type MISFET, there occurs such a defect that even the surface of the single crystal Si thin film 3 in the formation region 100 of the SOI-type MISFET is ground by the chemical-mechanical polishing when the chemical-mechanical polishing is terminated by taking the silicon nitride film 37 in the formation region 200 of the bulk-type MISFET as a terminal point of the polishing. On the other hand, there occurs such a defect that formation of the bulk-type MISFET to the surface of the semiconductor substrate 1 in the formation region 200 of the bulk-type MISFET cannot be performed due to that the surface of the silicon nitride film 37 in the formation region 200 of the bulk-type MISFET is not exposed and cannot be removed when the chemical-mechanical polishing is terminated by taking the silicon nitride film 37 in the formation region 100 of the SOI-type MISFET as a termination point of the polishing. In the present invention, by making the thickness of the silicon nitride film larger than the step between the surface of the single crystal Si thin film 3 in the formation region 100 of the SOI-type MISFET and the surface of the semiconductor substrate 1 in the formation region 200 of the bulk-type MISFET, these defects can be eliminated.

Figure 13:
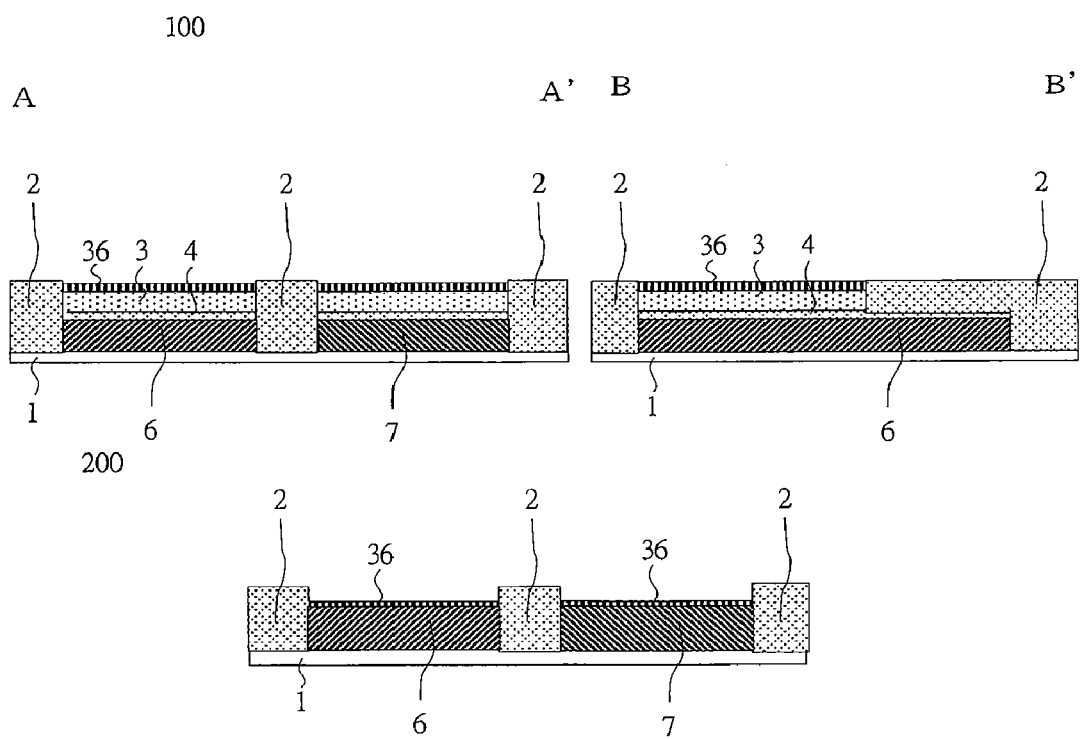
FIG. 13 is a diagram for describing a manufacturing step of the MISFET according to the first embodiment.

In FIG. 12, an N-conductive type well diffusion layer 6 is selectively formed in a desired region of the supporting substrate 1 by ion implantation via the thin silicon oxide film 36, the oxide film thin single crystal Si film 3, and the thin buried insulating film 4 as for the SOI-type MISFET formation region, and by ion implantation via the thin silicon oxide film 36 as for the bulk-type MISFET formation region. Subsequently, similarly, a P-conductive type well diffusion layer 7 is selectively formed in a desired region of the supporting substrate 1 by ion implantation via the thin silicon oxide film 36, the oxide film thin single crystal Si film 3, and the thin buried insulating film 4 as for the SOI-type MISFET formation region, and by ion implantation via the thin silicon oxide film 36 as for the bulk-type MISFET formation region. Herein, the single crystal Si film and the buried oxide film layer are respectively thin layers, and the step between the SOI-type MISFET formation region and the bulk-type MISFET formation region is as small as about 30 nm. On the other hand, a depth condition for implanting impurity ions for forming the N-conductive type well diffusion layer and the P-conductive type well diffusion layer is generally 500 nm or more, which is enough deep as compared to the step. Therefore, an ion implantation condition for well diffusion layer formation can be made common in regions of the SOI-type MISFET and the bulk-type MISFET, so that the well diffusion layer regions 6 and 7 for the SOI-type MISFET and the bulk-type MISFET can be formed by the same step (FIG. 13).

Figure 14:
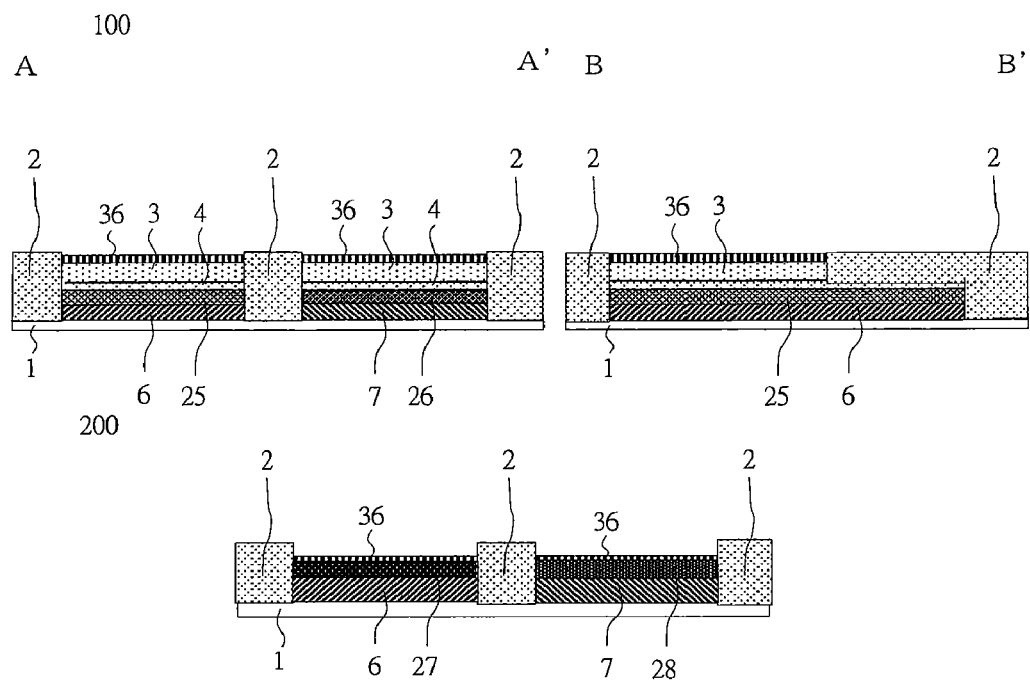
FIG. 14 is a diagram for describing a manufacturing step of the MISFET according to the first embodiment.

Subsequently, diffusion layer regions for threshold voltage control 25 and 26 in the N-type and P-type SOI-type MISFET formation regions are formed by ion implantation via the thin silicon oxide film 36, the thin single crystal Si film 3, and the thin buried insulating film 4. Thereafter, by ion implantation in the N-type and P-type bulk-type MISFET formation regions via the thin silicon oxide film 36, the N-conductive type and P-conductive type diffusion layer regions for threshold voltage control 27 and 28 are selectively formed in a desired region of the supporting substrate 1 (FIG. 14).

Figure 15:
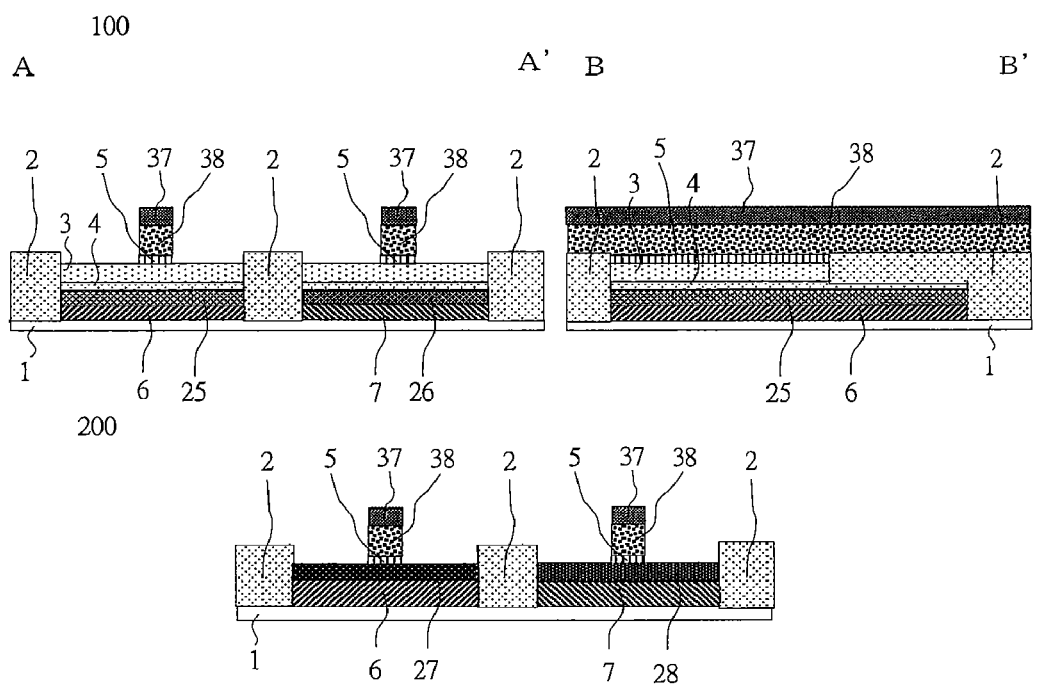
FIG. 15 is a diagram for describing a manufacturing step of the MISFET according to the first embodiment.

Subsequently, after the silicon oxide film 36 and the like are selectively removed by hydrofluoric acid cleaning and the like to expose the surface of the single crystal Si thin film 3, a thermal oxide film with a thickness of 1.8 nm is formed and a nitride film with a thickness of 0.2 nm is formed by deposition on the main surface by nitriding a surface of the thermal oxide film by NO gas, so that a gate insulating film 5 is formed. Subsequently, a polycrystalline Si film 38 having a thickness of, for example, 100 nm is deposited on the gate insulating film 5 by chemical vapor deposition method. Next, after a gate protective film mainly formed of the silicon nitride film 37 is deposited on the entire of the polycrystalline Si film 38, formation of a gate electrode and a gate protective film is performed by patterning according to a conventionally well-known method for manufacturing an MISFET (FIG. 15). A feature of the present invention is that a focus depth of photolithography in formation of the gate electrode by patterning the polycrystalline Silicon film serving as a gate material film is adjusted to be focused on the formation region 100 side of the SOI-type MISFET. Since there is a step between the surface of the single crystal Si thin film 3 in the formation region 100 of the SOI-type MISFET and the surface of the semiconductor substrate 1 in the formation region 200 of the bulk-type MISFET, when patterning of the gate electrode is performed by adjusting the focus depth to one region of the above regions, processing of the gate electrode in the other region cannot be made to form a shape as designed. Generally, however, since a high-withstand-voltage MISFET in which the dimension of a gate electrode is larger than that of the SOI-type MISFET is formed in the formation region of the bulk-type MISFET, influence on the bulk-type MISFET from shape variation of the gate electrode can be smaller in view of characteristics of MISFETs to be completed. In the present embodiment, an impurity for achieving low resistance is not introduced into any gate electrode of the N-conductive type IGFET and a P-conductive type IGFET.

Figure 16:
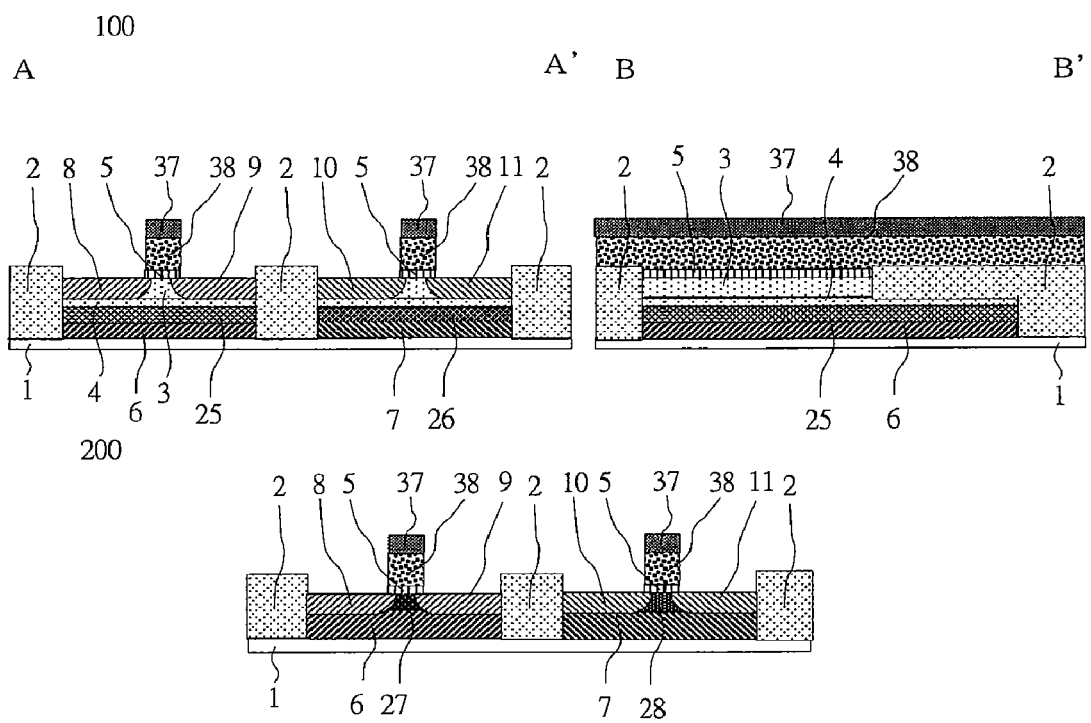
FIG. 16 is a diagram for describing a manufacturing step of the MISFET according to the first embodiment.

Subsequently, from FIG. 15, for example, As ion is implanted to the SOI-type and bulk-type N-conductive type MISFET regions and $BF_2$ ion is implanted to the SOI-type and bulk-type P-conductive type MISFET regions by acceleration energies of 1 keV and 600 eV, respectively, under a condition of implantation dose of $4\times10^{15}/cm^2$, so that an ultra-shallow N-conductive type high-concentration source diffusion layer 8, an ultra-shallow N-conductive type high-concentration drain diffusion layer 9, an ultra-shallow P-conductive type high-concentration source diffusion layer 10, and an ultra-shallow P-conductive type high-concentration drain diffusion layer 11 are formed in the main surface region of the single crystal Si film 3 (FIG. 16). Herein, as described above, since the step between the SOI-type MISFET formation region and the bulk-type MISFET formation region is as small as about 30 nm, ion implantation conditions for formation of the ultra-shallow high-concentration source diffusion layer region and an ion implantation condition for formation of the drain diffusion layer region in the SOI-type MISFET region and the bulk-type MISFET region can be made common, so that the ultra-shallow high-concentration source diffusion layer region and the drain diffusion layer region for the SOI-type MISFET and the bulk-type MISFET can be formed in the same step.

Figure 17:
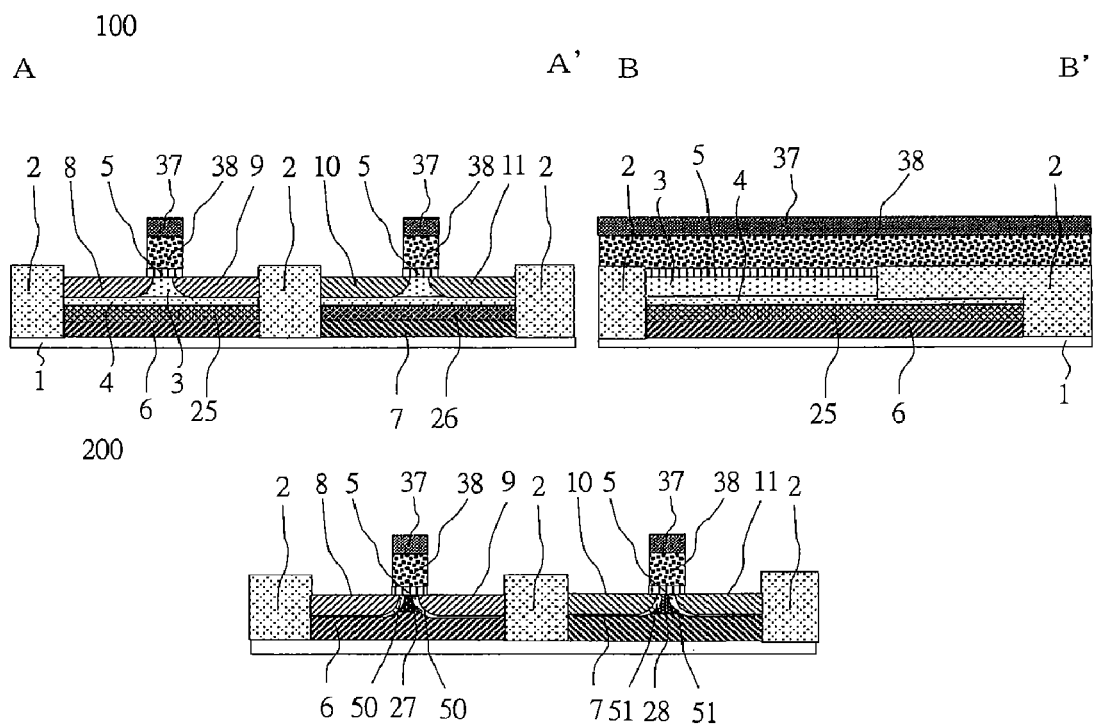
FIG. 17 is a diagram for describing a manufacturing step of the MISFET according to the first embodiment.

Subsequently, in FIG. 16, for example, B (boron) ion is implanted to the bulk-type N-conductive type MISFET region 200 by an acceleration energy of 10 keV under the condition of an implantation dose of $1\times10^{13}/cm^2$, and, for example, P (phosphorus) ion is implanted to the P-conductive type MISFET region by an acceleration energy of 10 keV under the condition of an implantation dose of $1\times10^{13}/cm^2$ while a gate protective insulating film 51 is used as an implantation blocking mask, thereby forming halo regions 50 and 51, respectively (FIG. 17). This is an ion implantation step performed to suppress the short-channel effect of the bulk-type MISFET. Herein, in order to enhance this suppression effect of the short-channel effect, there is no problem in adopting oblique ion implantation of a tilt angle of, for example, 20° as a halo formation condition.

Figure 18:
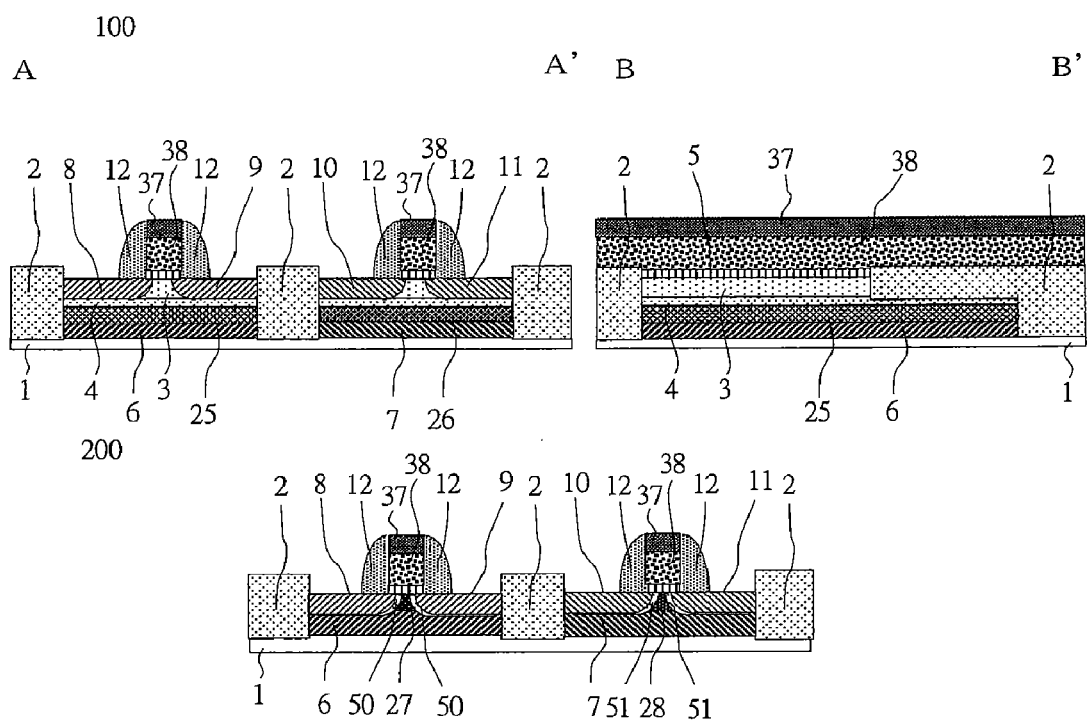
FIG. 18 is a diagram for describing a manufacturing step of the MISFET according to the first embodiment.
Figure 19:
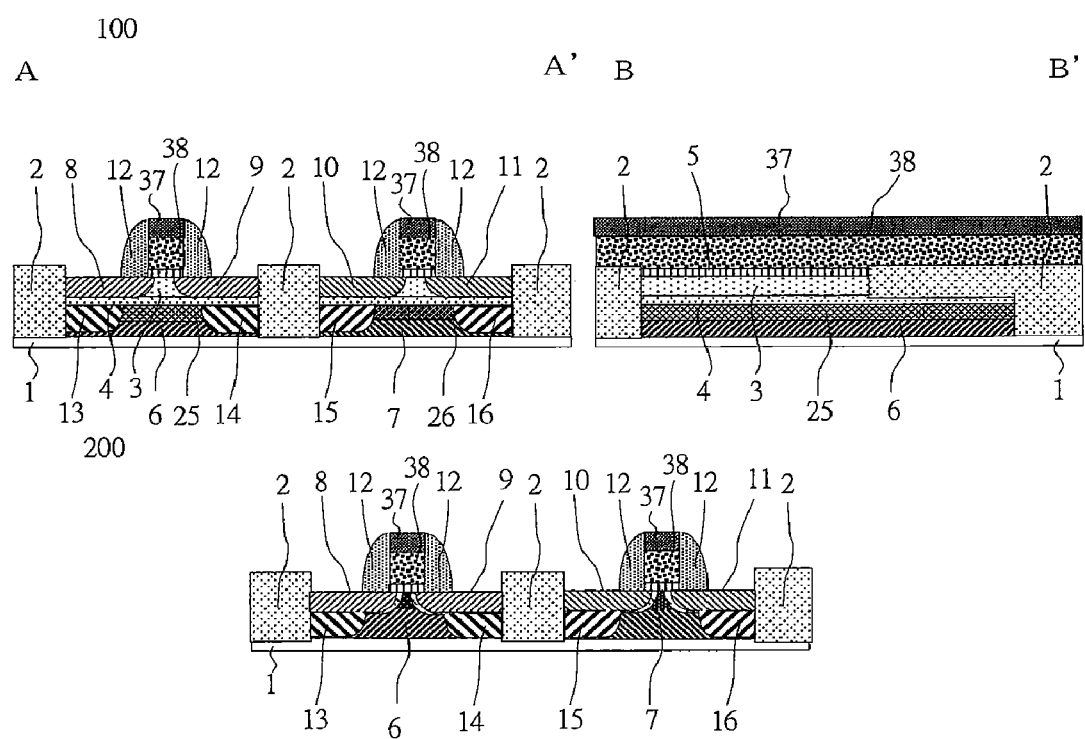
FIG. 19 is a diagram for describing a manufacturing step of the MISFET according to the first embodiment.

In FIG. 17, a silicon oxide film with a film thickness of, for example, 70 nm is deposited overall and is subjected to anisotropic etching to be selectively left on a sidewall portion of the gate electrode to form a gate sidewall insulating film 12 (FIG. 18). Subsequently, in FIG. 18, for example, As ion is implanted to the SOI-type and bulk-type N-conductive type MISFET regions, and BF2 ion is implanted to the SOI-type and bulk-type P-conductive type MISFET regions by acceleration energies of, for example, 25 keV and 15 eV, respectively, under the condition of an implantation dose of $4\times10^{15}/cm^2$ while the gate electrode and the gate sidewall insulating film 12 are used as implantation blocking masks, so that N-type source diffusion layer and drain diffusion layer regions 13 and 14, and P-type source diffusion layer and drain diffusion layer regions 15 and 16 are formed which are further deeper than the ultra-shallow high-concentration source diffusion layer the drain diffusion layer regions, respectively (FIG. 19). Herein, the deep source diffusion layer and drain diffusion layer regions are formed in the SOI-type MISFET regions for the purpose of capacitance reduction of the source and drain diffusion layer regions. These are formed by a manufacturing method similar to a conventionally well-known method for reducing a junction capacitance of the bulk-type MISFET. That is, the purpose is to form impurity compensation region for making close to an intrinsic impurity region by implanting an opposite conductive type ion with a concentration and an acceleration energy which should compensate for the implantation ion for threshold voltage adjustment previously implanted by ion implantation taking an implantation blocking mask. On the other hand, the bulk-type MISFET is formed for a purpose of forming low-resistance source and drain diffusion layer regions according to a similar process to source and drain diffusion layer regions of a conventionally well-known bulk-type MISFET. As described above, according to the present invention, an ion implantation step for parasitic capacitance reduction of the source and drain diffusion layer regions of the SOI-type MISFET region and an ion implantation step for achieving low resistance of the source and drain diffusion layer regions of the bulk-type MISFET region can be formed at a common step under the same condition. Consequently, the process can be simplified.

Figure 20:
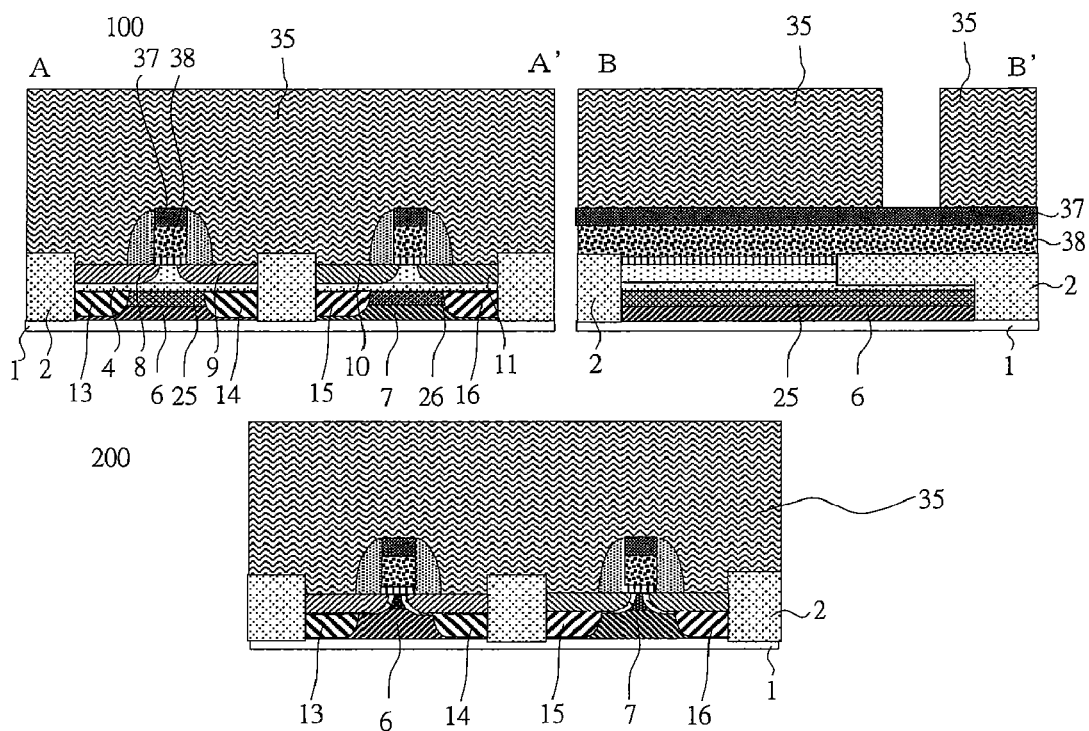
FIG. 20 is a diagram for describing a manufacturing step of the MISFET according to the first embodiment.
Figure 21:
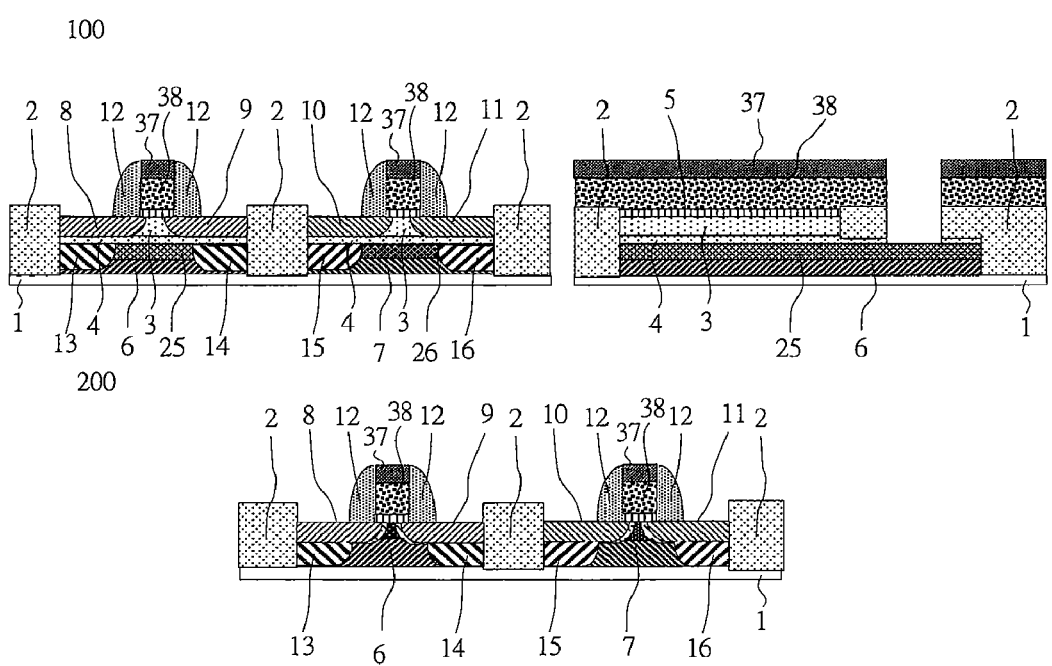
FIG. 21 is a diagram for describing a manufacturing step of the MISFET according to the first embodiment.

Next, from FIG. 19, in the SOI-type MISFET, the resist mask 35 is applied in order to form a region for forming a contact between the gate and well, and only the resist mask in a desired region of the SOI-type MISFET is removed (FIG. 20). Thereafter, the silicon nitride film 37, the polycrystalline Silicon film 38, the thin silicon oxide film 36, and the buried oxide film 4 in the desired region are removed (FIG. 21).

Figure 22:
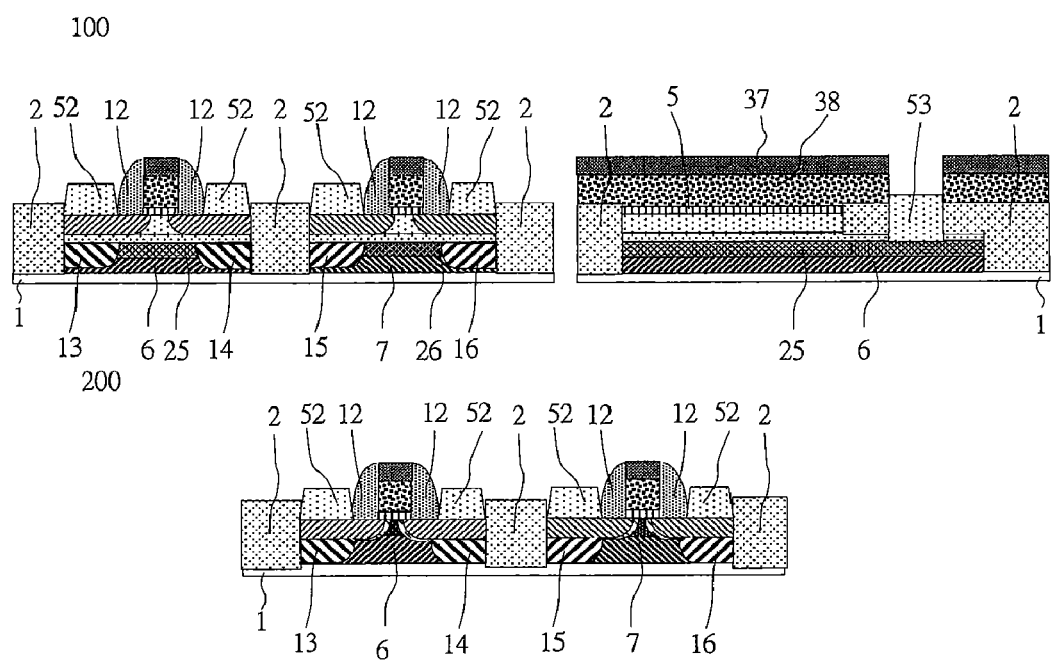
FIG. 22 is a diagram for describing a manufacturing step of the MISFET according to the first embodiment.

In this state, Si films 52 and 53 having a thickness of, for example, 60 nm are selectively deposited on the single crystal Si regions exposed by using selective epitaxial method. By this step, single crystal Si is selectively grown epitaxially to the 52 on the source and drain diffusion layer regions, and, in the SOI-type MISFET, to the 53 on the contact formation region of the gate and well (FIG. 22). In the present invention, the formation step of the contact between the gate electrode and the well is performed by selective epitaxial growth simultaneously with the formation step of the stacked Si film on the source and drain diffusion layers. Accordingly, it is unnecessary to perform the formation step of the contact as a step independent from the other steps, thereby simplifying the process. Note that, in order to connect the gate electrode and the well electrically, the single crystal Si is required to be subjected to selective epitaxial growth until an upper surface of the Si film 53 becomes higher than a lower surface of the gate electrode.

Figure 23:
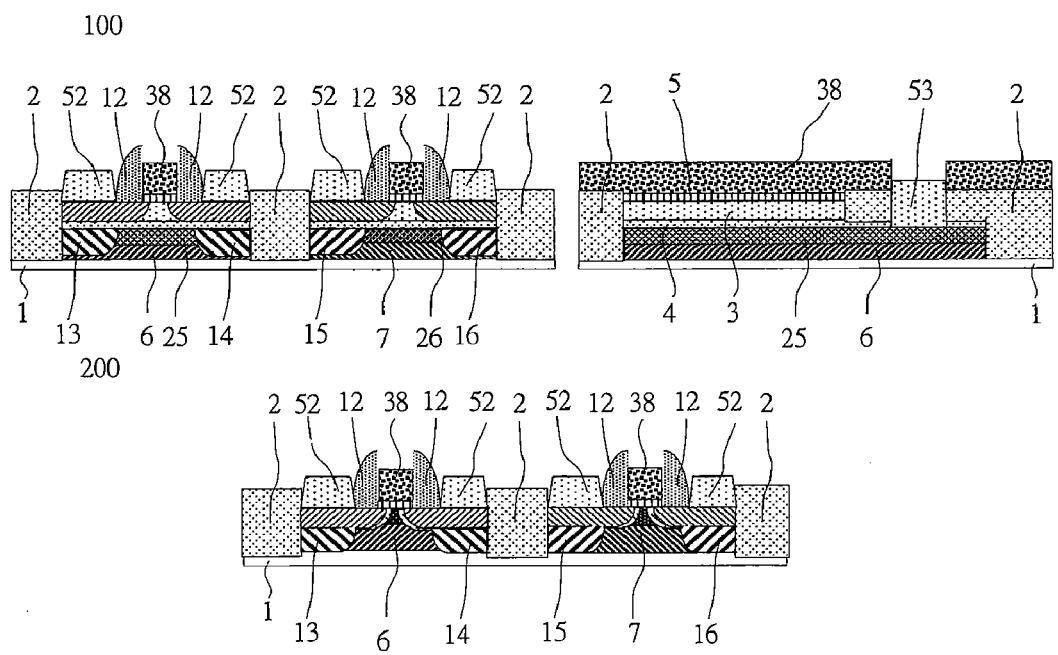
FIG. 23 is a diagram for describing a manufacturing step of the MISFET according to the first embodiment.
Figure 24:
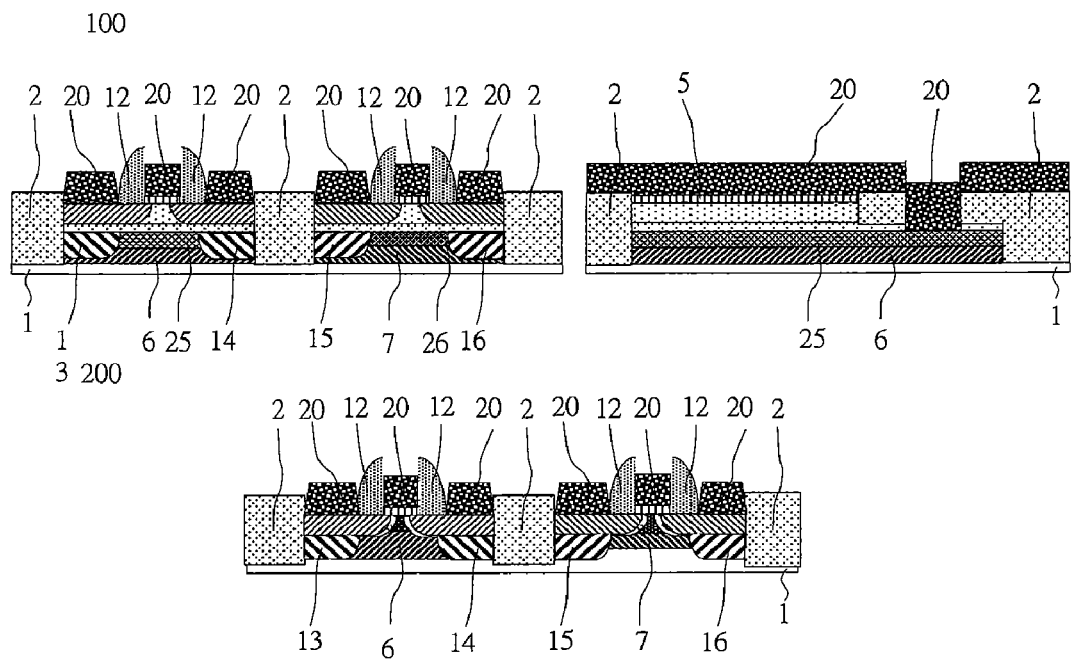
FIG. 24 is a diagram for describing a manufacturing step of the MISFET according to the first embodiment.

From the state in FIG. 22, the silicon nitride film 37 is selectively removed by hot phosphoric acid (FIG. 23) to expose the silicon gate polycrystalline Si film 38, and then a Ni (nickel) film of 30 nm thick is then deposited on the entire surface by sputtering, the whole region of the gate electrode exposed and at least an upper region of N-conductive type and P-conductive type high-concentration stacked regions are selectively silicided by thermal treatment at 450° C. to make a silicide gate electrode, a silicide metal source, and a drain region 20. In the above silicidation treatment, the silicon gate electrode where the impurity has not yet been added is transformed into a nickel silicide film up to a region contacting with the gate insulating film to have lower resistance. Not all the stacked Si film on the source and drain diffusion layers is transformed, a low-resistive polycrystalline Si film is left in a bottom surface region, the ultra-shallow N-conductive type source and drain diffusion layers 8 and 9 and the shallow P-conductive type source and drain diffusion layers 10 and 11 in the thin single crystal Si are reserved. After the silicidation treatment, only the unreacted Ni film on the insulating film is removed selectively by an etching solution by means of a mixed solution of hydrochloric acid and hydrogen peroxide solution (FIG. 24).

Figure 25:
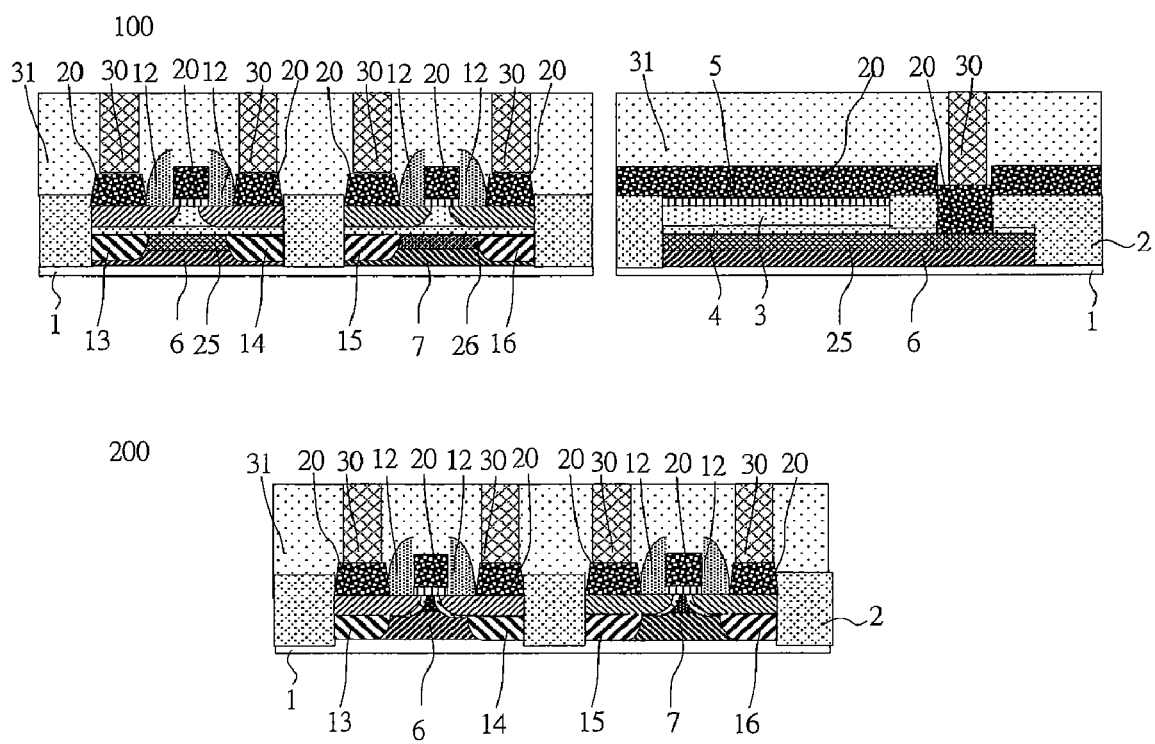
FIG. 25 is a diagram for describing a manufacturing step of the MISFET according to the first embodiment.

From this state, deposition and planarization polishing of a wiring interlayer insulating film, a wiring step including an wiring interlayer insulating film 31 and the like are performed, and a semiconductor device is manufactured through further second wiring step (FIG. 25).

In the semiconductor device according to the present embodiment, the gate electrode 20 is made of a metal silicide film. In this manner, in the semiconductor device according to the present embodiment, despite it is a full depletion type SOIIGFET, a threshold voltage value can be set to about 0 V in both the N-conductive type MISFET and the P-conductive type MISFET. Further, in spite of the fact that the single crystal Si thin film 3 constituting a channel is finally made as ultra-thin as 10 nm, since the source and drain regions are configured as a stacked structure and further a major part of the stacked structure can be made of the metal silicide film 20, such a problem of increase of contact resistance between the semiconductor and the metal silicide film and increase of serial resistance is solved. Moreover, in the semiconductor device according to the present embodiment, the ion implantation step for reducing parasitic capacitance of the source and drain diffusion layer regions of the SOI-type MISFET region and the ion implantation step for achieving lower resistance of the source and drain diffusion layer regions of the bulk-type MISFET region are formed in a common step under the same condition, so that high drive current of the SOI-type MISFET can be realized and reduction of a bottom parasitic capacitance of the well diffusion layers 6 and 7 can be realized simultaneously. In this manner, as compared to the well structure in a case where ion implantation for capacitance reduction is not performed, the parasitic capacitance can be reduced by about 1 digit even in the same occupied area configuration of well. Further, in the semiconductor device according to the present embodiment, since the gate electrode which is a lowermost layer wiring can be directly connected with the well diffusion layer, it is possible to set the connection region regardless of the upper wirings. In this manner, since the connection made by the upper wiring in a margin region taking into account the layout of the lower-layer wiring as having been done in a conventionally well-known structure is not required, high current and high drive performance of the semiconductor device can be realized without increase of the occupied area. The feature of the embodiment that increase of the occupied area is not required gains an effect also on further reduction of the parasitic capacitance. Therefore, since there is a wide variety of circuits to which the semiconductor device according to the present embodiment is applicable, it is most effective to apply the semiconductor device to a memory cell of an SRAM, an I/O buffer circuit as described below, and further a drive region of a critical path which defines an operation speed of an integrated circuit and the like.

In the semiconductor device according to the present embodiment, even in a case where these high-performance SOI type MISFET 100 and a high-withstand-voltage system device, and the bulk-type MISFET 200 for ESD protection for preventing ESD breakdown (electrostatic breakdown) are formed on the same substrate, by making manufacturing steps of the SOI-type MISFET and the bulk-type MISFET common, the whole semiconductor device can be scaled down and further the semiconductor can be manufactured without complicating the process. Further, in the semiconductor device according to the present embodiment, it is preferable to make the thin buried insulating film 4 as thin as possible within a range of a film thickness allowing to ignore leakage current and it is preferable to make the thin buried insulating film 4 have a film thickness of 10 nm or less, more preferably, about 2 nm which is similar to the gate insulating film 5.

In the semiconductor device according to the present embodiment, the gate insulating material is not limited to an Ni silicide film, and any material can be used as long as it has a work function positioned nearly in the center of the forbidden band of the single crystal Si thin film among a metal, a metal silicide film, or a metal nitride film of such as Ni, Co, Ti, W, Ta, Mo, Cr, Al, Pt, Pa and Ru.

Second Embodiment

Figure 26:
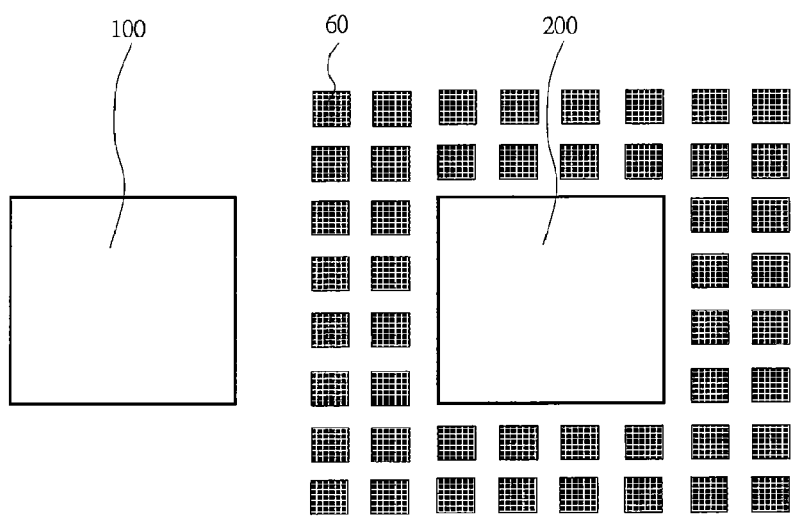
FIG. 26 is a layout diagram of a semiconductor device according to a second embodiment of the present invention.

Next, a semiconductor device according to a second embodiment of the present invention will be described. In the present embodiment, though the semiconductor device is manufactured according to the first embodiment, it has a different layout the second embodiment and has been invented to be capable of forming a bulk-type MISFET more stably. In the present embodiment, the layout at the step of removing the resist mask is different only in the region 200 in FIG. 4 in which the bulk-type MISFET is formed. In the first embodiment, the silicon oxide film 36, the single crystal Si layer 3 and the thin buried insulating film 4 are removed except for the region 200 in which the bulk-type MISFET is formed to expose the supporting substrate surface. On the other hand, in the second embodiment, as shown in the plan view of FIG. 26, a dummy pattern 60 is provided around the region 200 in which the bulk-type MISFET is formed, and the silicon oxide film 36, the single crystal Si layer 3 and the thin buried insulating film 4 around the region 200 in which the bulk-type MISFET is formed are left. Incidentally, the dummy pattern 60 is formed by the resist mask 35 applied in the step of FIG. 4 of the first embodiment.

The dummy pattern 60 formed in the present embodiment is a pattern provided for suppressing dishing generated in the chemical-mechanical polishing step for forming the device isolation region in the step of FIG. 12 of the first embodiment. Generally, in chemical-mechanical polishing, when steps are scattered in a region to be polished, there occurs the problem of such dishing that, for example, a low-step region is selectively polished. In a case of the present invention, since the bulk-type MISFET is formed in the low step region, there is a possibility that the bulk-type MISFET region 200 is selectively polished when the chemical-mechanical polishing step for forming the device isolation region of FIG. 12 of the first embodiment is performed. The larger bulk-type MISFET region 200 becomes than the SOI-type MISFET region 100, the higher possibility becomes. Accordingly, in the second embodiment, the dummy pattern 60 is formed, and the silicon oxide film 36, the single crystal Si layer 3 and the thin buried insulating film 4 around the region 200 in which the bulk-type MISFET is formed are left, so that only the region 200 in which the bulk-type MISFET is formed becomes the low step region, and the periphery thereof becomes a high step region. This manner allows suppression of the dishing in the bulk-type MISFET region 200 when the chemical-mechanical polishing step for forming the device isolation region is performed, so that the bulk-type MISFET region can be formed more stably.

Further, in the semiconductor device according to the present embodiment, the gate electrode 20 is made of a metal silicide film. Therefore, in the semiconductor device according to the present embodiment, the threshold voltage value can be set to about 0 V in both the N-conductive type MISFET and the P-conductive type MISFET despite the full depletion type SOIIGFET. Further, in spite of the fact that the single crystal Si thin film 3 constituting the channel is finally formed to be as ultra-thin as 10 nm, since the source and drain regions are configured as a stacked structure, and further, most of the stacked structure can be made of a metal silicide film, such a problem as increase of contact resistance between the semiconductor and the metal silicide film and increase of serial resistance can be eliminated. Moreover, in the semiconductor device according to the present embodiment, by performing the ion implantation step for parasitic capacitance reduction of the source and drain diffusion layer regions of the SOI-type MISFET region and the ion implantation step for achieving lower resistance of the source and drain diffusion layer regions of the bulk-type MISFET region in a common step under the same condition, high drive current of the SOI-type MISFET can be realized and simultaneously reduction of bottom parasitic capacitance of the well diffusion layers 6 and 7 can be realized. In this manner, as compared to the well structure in a case where ion implantation for capacitance reduction is not performed, the parasitic capacitance can be reduced by about 1 digit even in the same occupied area configuration of well. Further, in the semiconductor device according to the present embodiment, since the gate electrode which is a lowermost layer wiring can be directly connected with the well diffusion layer, it is possible to set the connection region regardless of the upper wirings. In this manner, since the connection made by the upper wiring in a margin region taking into account the layout of the lower-layer wiring as having been done in a conventionally well-known structure is not required, high current and high drive performance of the semiconductor device can be realized without increase of the occupied area. The feature of the embodiment that increase of the occupied area is not required gains an effect also on further reduction of the parasitic capacitance. Therefore, since there is a wide variety of circuits to which the semiconductor device according to the present embodiment is applicable, it is most effective to apply the semiconductor device to a memory cell of an SRAM, an I/O buffer circuit as described below, and further a drive region of a critical path which defines an operation speed of an integrated circuit and the like.

In the semiconductor device according to the present embodiment, even in a case where these high-performance SOI type MISFET 100 and a high-withstand-voltage system device, and the bulk-type MISFET 200 for ESD protection for preventing ESD breakdown (electrostatic breakdown) are formed on the same substrate, by making manufacturing steps of the SOI-type MISFET and the bulk-type MISFET common, the whole semiconductor device can be scaled down and further the semiconductor can be manufactured without complicating the process. Further, in the semiconductor device according to the present embodiment, it is preferable to make the thin buried insulating film 4 as thin as possible within a range of a film thickness allowing to ignore leakage current and it is preferable to make the thin buried insulating film 4 have a film thickness of 10 nm or less, more preferably, about 2 nm which is similar to the gate insulating film 5.

In the semiconductor device according to the present embodiment, the gate insulating material is not limited to an Ni silicide film, and any material can be used as long as it has a work function positioned nearly in the center of the forbidden band of the single crystal Si thin film among a metal, a metal silicide film, or a metal nitride film of such as Ni, Co, Ti, W, Ta, Mo, Cr, Al, Pt, Pa and Ru.

Third Embodiment

Figure 27:
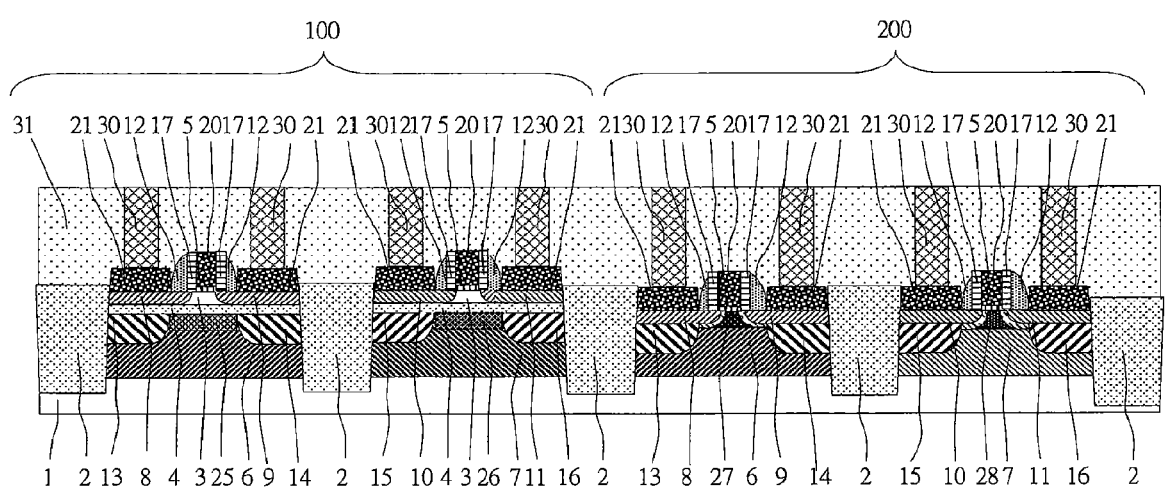
FIG. 27 is a sectional view of a completed MISFET according to a third embodiment of the present invention.

FIG. 27 is a sectional view of a semiconductor device showing a third embodiment according to the present invention. In the present embodiment, though the semiconductor device is manufactured basically in a similar manner as the abovedescribed embodiments, in the third embodiment, prior to formations of the ultra-shallow N-conductive type high-concentration source diffusion layer 8 and the ultra-shallow N-conductive type high-concentration drain diffusion layer 9, and the ultra-shallow P-conductive type high-concentration source diffusion layer 10 and the ultra-shallow P-conductive type high-concentration drain diffusion layer 11, formation of an offset spacer 17 are performed on sidewalls of the gate electrode. The offset spacer 17 is formed on the sidewalls of the gate electrode by depositing, for example, a silicon oxide film, a silicon nitride, a titanium oxide film, or the like by about 10 nm by CVD method and etching back the insulating film. The ultra-shallow high-concentration source and drain diffusion layers are formed by ion implantation utilizing the gate electrode and the thin insulating layer for implantation blocking.

In the present embodiment, since the ultra-shallow N-conductive type high-concentration source diffusion layer 8, the ultra-shallow N-conductive type high concentration drain diffusion layer 9, and the ultra-shallow P-conductive type high concentration source diffusion layer 10 and the ultra-shallow P-conductive type high concentration drain diffusion layer 11 are formed while the offset spacer 17 is used as a mask, horizontal spread of the diffusion layer regions toward the channel region 3 can be suppressed, and so an overlapping region of the gate electrode 20 and the ultra-shallow high-concentration source and drain diffusion layers is small, so that an effective channel length can be secured. This allows the MISFET to be further miniaturized as compared to the first embodiment. Further, since an overlapping capacitor between the gate electrode 20 and the ultra-shallow high concentration source and drain diffusion layers can be kept small, the parasitic capacitance is reduced, so that higher speed of the MISFET can be achieved as compared to the first embodiment.

Further, in the semiconductor device according to the present embodiment, the gate electrode 20 is made of a metal silicide film. In this manner, in the semiconductor device according to the present embodiment, despite it is a full depletion type SOIIGFET, a threshold voltage value can be set to about 0 V in both the N-conductive type MISFET and the P-conductive type MISFET. Further, in spite of the fact that the single crystal Si thin film 3 constituting a channel is finally made as ultra-thin as 10 nm, since the source and drain regions are configured as a stacked structure and further a major part of the stacked structure can be made of the metal silicide film 20, such a problem of increase of contact resistance between the semiconductor and the metal silicide film and increase of serial resistance is solved. Moreover, in the semiconductor device according to the present embodiment, the ion implantation step for reducing parasitic capacitance of the source and drain diffusion layer regions of the SOI-type MISFET region and the ion implantation step for achieving lower resistance of the source and drain diffusion layer regions of the bulk-type MISFET region are formed in a common step under the same condition, so that high drive current of the SOI-type MISFET can be realized and reduction of a bottom parasitic capacitance of the well diffusion layers 6 and 7 can be realized simultaneously. In this manner, as compared to the well structure in a case where ion implantation for capacitance reduction is not performed, the parasitic capacitance can be reduced by about 1 digit even in the same occupied area configuration of well. Further, in the semiconductor device according to the present embodiment, since the gate electrode which is a lowermost layer wiring can be directly connected with the well diffusion layer, it is possible to set the connection region regardless of the upper wirings. In this manner, since the connection made by the upper wiring in a margin region taking into account the layout of the lower-layer wiring as having been done in a conventionally well-known structure is not required, high current and high drive performance of the semiconductor device can be realized without increase of the occupied area. The feature of the embodiment that increase of the occupied area is not required gains an effect also on further reduction of the parasitic capacitance. Therefore, since there is a wide variety of circuits to which the semiconductor device according to the present embodiment is applicable, it is most effective to apply the semiconductor device to a memory cell of an SRAM, an I/O buffer circuit as described below, and further a drive region of a critical path which defines an operation speed of an integrated circuit and the like.

In the semiconductor device according to the present embodiment, even in a case where these high-performance SOI type MISFET 100 and a high-withstand-voltage system device, and the bulk-type MISFET 200 for ESD protection for preventing ESD breakdown (electrostatic breakdown) are formed on the same substrate, by making manufacturing steps of the SOI-type MISFET and the bulk-type MISFET common, the whole semiconductor device can be scaled down and further the semiconductor can be manufactured without complicating the process. Further, in the semiconductor device according to the present embodiment, it is preferable to make the thin buried insulating film 4 as thin as possible within a range of a film thickness allowing to ignore leakage current and it is preferable to make the thin buried insulating film 4 have a film thickness of 10 nm or less, more preferably, about 2 nm which is similar to the gate insulating film 5.

In the semiconductor device according to the present embodiment, the gate insulating material is not limited to an Ni silicide film, and any material can be used as long as it has a work function positioned nearly in the center of the forbidden band of the single crystal Si thin film among a metal, a metal silicide film, or a metal nitride film of such as Ni, Co, Ti, W, Ta, Mo, Cr, Al, Pt, Pa and Ru.

Fourth Embodiment

Figure 28:
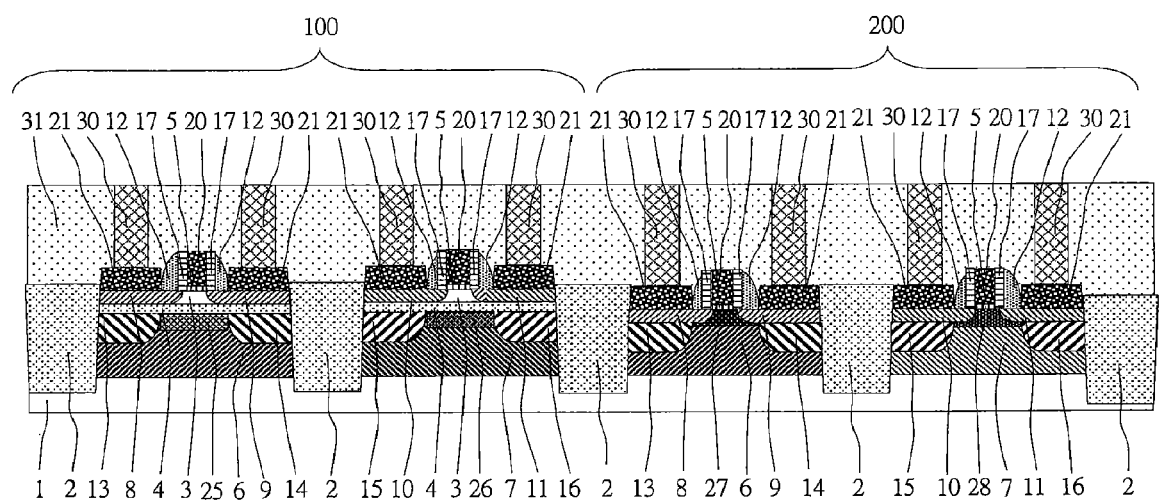
FIG. 28 is a sectional view of a completed MISFET according to a fourth embodiment of the present invention.

FIG. 28 is a sectional view of a semiconductor device showing a fourth embodiment according to the present invention. In the present embodiment, though the semiconductor device is manufactured basically in a similar manner as the abovedescribed embodiments, in the fourth embodiment, the bulk-type MISFET is formed without forming the halo regions 50 and 51. The halo regions 50 and 51 are formed for suppressing the short-channel effect when a MISFET is miniaturized. When a miniaturized MISFET is not formed, a bulk-type MISFET can be formed in the bulk-type region 200 without forming the halo regions 50 and 51 according to the fourth embodiment. This manner allows the SOI-type MISFET and the bulk-type MISFET to be formed on the same substrate while further simplifying the process.

Further, in the semiconductor device according to the present embodiment, the gate electrode 20 is made of a metal silicide film. In this manner, in the semiconductor device according to the present embodiment, despite it is a full depletion type SOIIGFET, a threshold voltage value can be set to about 0 V in both the N-conductive type MISFET and the P-conductive type MISFET. Further, in spite of the fact that the single crystal Si thin film 3 constituting a channel is finally made as ultra-thin as 10 nm, since the source and drain regions are configured as a stacked structure and further a major part of the stacked structure can be made of the metal silicide film 20, such a problem of increase of contact resistance between the semiconductor and the metal silicide film and increase of serial resistance is solved. Moreover, in the semiconductor device according to the present embodiment, the ion implantation step for reducing parasitic capacitance of the source and drain diffusion layer regions of the SOI-type MISFET region and the ion implantation step for achieving lower resistance of the source and drain diffusion layer regions of the bulk-type MISFET region are formed in a common step under the same condition, so that high drive current of the SOI-type MISFET can be realized and reduction of a bottom parasitic capacitance of the well diffusion layers 6 and 7 can be realized simultaneously. In this manner, as compared to the well structure in a case where ion implantation for capacitance reduction is not performed, the parasitic capacitance can be reduced by about 1 digit even in the same occupied area configuration of well. Further, in the semiconductor device according to the present embodiment, since the gate electrode which is a lowermost layer wiring can be directly connected with the well diffusion layer, it is possible to set the connection region regardless of the upper wirings. In this manner, since the connection made by the upper wiring in a margin region taking into account the layout of the lower-layer wiring as having been done in a conventionally well-known structure is not required, high current and high drive performance of the semiconductor device can be realized without increase of the occupied area. The feature of the embodiment that increase of the occupied area is not required gains an effect also on further reduction of the parasitic capacitance. Therefore, since there is a wide variety of circuits to which the semiconductor device according to the present embodiment is applicable, it is most effective to apply the semiconductor device to a memory cell of an SRAM, an I/O buffer circuit, and further a drive region of a critical path which defines an operation speed of an integrated circuit and the like.

In the semiconductor device according to the present embodiment, even in a case where these high-performance SOI type MISFET 100 and a high-withstand-voltage system device, and the bulk-type MISFET 200 for ESD protection for preventing ESD breakdown (electrostatic breakdown) are formed on the same substrate, by making manufacturing steps of the SOI-type MISFET and the bulk-type MISFET common, the whole semiconductor device can be scaled down and further the semiconductor can be manufactured without complicating the process. Further, in the semiconductor device according to the present embodiment, it is preferable to make the thin buried insulating film 4 as thin as possible within a range of a film thickness allowing to ignore leakage current and it is preferable to make the thin buried insulating film 4 have a film thickness of 10 nm or less, more preferably, about 2 nm which is similar to the gate insulating film 5.

In the semiconductor device according to the present embodiment, the gate insulating material is not limited to an Ni silicide film, and any material can be used as long as it has a work function positioned nearly in the center of the forbidden band of the single crystal Si thin film among a metal, a metal silicide film, or a metal nitride film of such as Ni, Co, Ti, W, Ta, Mo, Cr, Al, Pt, Pa and Ru.

Fifth Embodiment

Figure 29:
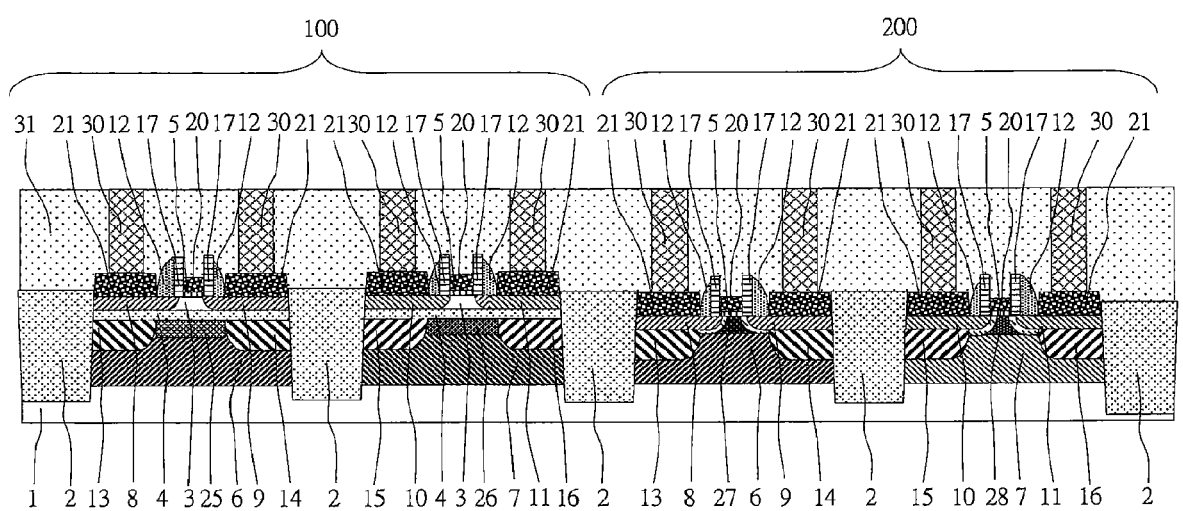
FIG. 29 is a sectional view of a completed MISFET according to a fifth embodiment of the present invention.
Figure 30:
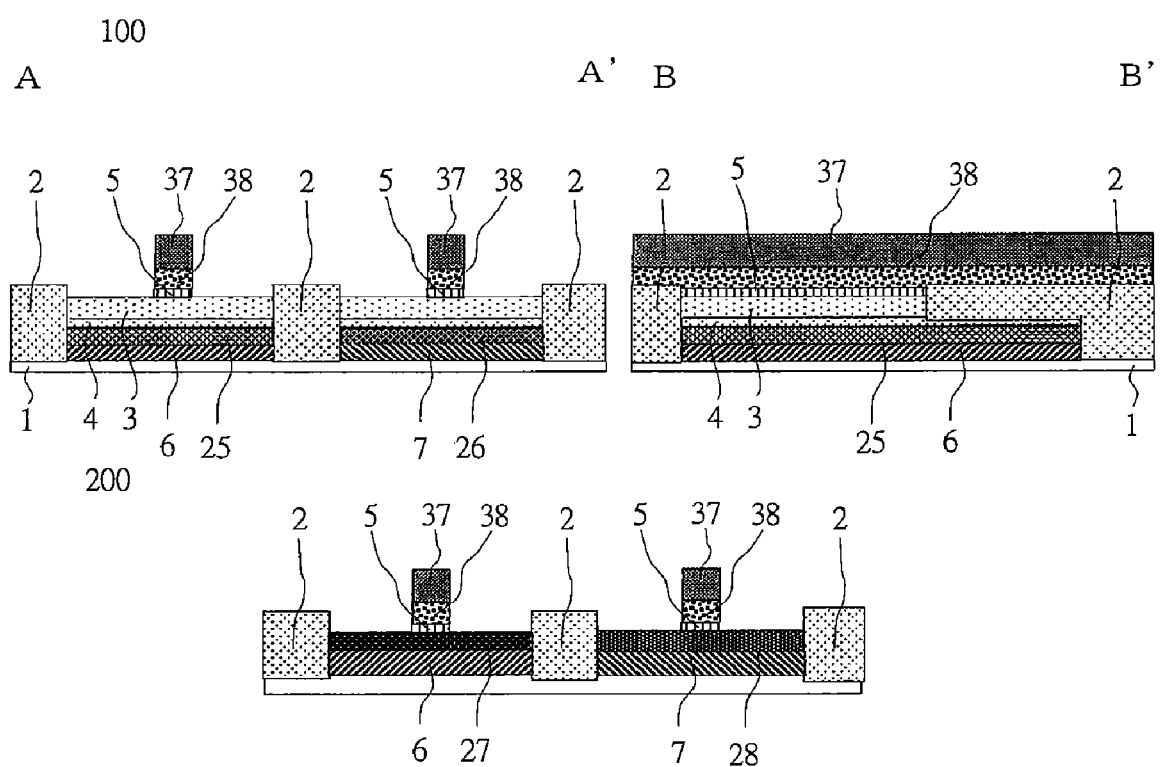
FIG. 30 is a diagram for describing a manufacturing step of a MISFET according to the fifth embodiment.

FIG. 29 is a sectional view of a semiconductor device showing a fifth embodiment according to the present invention. In the present embodiment, though the semiconductor device is manufactured basically in a similar manner as the abovedescribed embodiments, a feature thereof is that the diffusion layer region 21 stacked on the source and drain is formed to be higher than the gate electrode 20, as shown in FIG. 29. This is realized by changing a film thickness ratio of the silicon gate polycrystalline Si film 38 and the silicon nitride film 37 to be deposited in the step of forming the gate electrode of FIG. 15 in the first embodiment. Herein, in the present invention, it is required to silicide the whole region of the gate electrode 20 to make a silicided gate electrode. On the other hand, it is required to silicide not all the stacked Si film on the source and drain diffusion layers, leave a low-resistive polycrystalline Si film in the bottom surface region, and reserve the ultra-shallow N-conductive type source and drain diffusion layers 8 and 9 and the shallow P-conductive type source and drain diffusion layers 10 and 11 in the thin single crystal Si. This is because, if all of these are silicided down to their bottom surface regions, contact areas of the channel region and the source and drain diffusion layers are reduced, which results in increase of resistance. According to the present invention, since the height of the gate electrode 20 is set to be smaller than that of the diffusion layer region 21 deposited on the source and drain, not all the deposited Si film on the source and drain diffusion layers is silicided even if the whole region of the gate electrode 20 is silicide, so a low-resistive polycrystalline Si film is left in the bottom surface region.

In this manner, by applying the present embodiment, a method for manufacturing a semiconductor device of a good-quality product with good yield can be provided.

Further, in the semiconductor device according to the present embodiment, the gate electrode 20 is made of a metal silicide film. In this manner, in the semiconductor device according to the present embodiment, despite it is a full depletion type SOIIGFET, a threshold voltage value can be set to about 0 V in both the N-conductive type MISFET and the P-conductive type MISFET. Further, in spite of the fact that the single crystal Si thin film 3 constituting a channel is finally made as ultra-thin as 10 nm, since the source and drain regions are configured as a stacked structure and further a major part of the stacked structure can be made of the metal silicide film 20, such a problem of increase of contact resistance between the semiconductor and the metal silicide film and increase of serial resistance is solved. Moreover, in the semiconductor device according to the present embodiment, the ion implantation step for reducing parasitic capacitance of the source and drain diffusion layer regions of the SOI-type MISFET region and the ion implantation step for achieving lower resistance of the source and drain diffusion layer regions of the bulk-type MISFET region are formed in a common step under the same condition, so that high drive current of the SOI-type MISFET can be realized and reduction of a bottom parasitic capacitance of the well diffusion layers 6 and 7 can be realized simultaneously. In this manner, as compared to the well structure in a case where ion implantation for capacitance reduction is not performed, the parasitic capacitance can be reduced by about 1 digit even in the same occupied area configuration of well. Further, in the semiconductor device according to the present embodiment, since the gate electrode which is a lowermost layer wiring can be directly connected with the well diffusion layer, it is possible to set the connection region regardless of the upper wirings. In this manner, since the connection made by the upper wiring in a margin region taking into account the layout of the lower-layer wiring as having been done in a conventionally well-known structure is not required, high current and high drive performance of the semiconductor device can be realized without increase of the occupied area. The feature of the embodiment that increase of the occupied area is not required gains an effect also on further reduction of the parasitic capacitance. Therefore, since there is a wide variety of circuits to which the semiconductor device according to the present embodiment is applicable, it is most effective to apply the semiconductor device to a memory cell of an SRAM, an I/O buffer circuit, and further a drive region of a critical path which defines an operation speed of an integrated circuit and the like.

In the semiconductor device according to the present embodiment, even in a case where these high-performance SOI type MISFET 100 and a high-withstand-voltage system device, and the bulk-type MISFET 200 for ESD protection for preventing ESD breakdown (electrostatic breakdown) are formed on the same substrate, by making manufacturing steps of the SOI-type MISFET and the bulk-type MISFET common, the whole semiconductor device can be scaled down and further the semiconductor can be manufactured without complicating the process. Further, in the semiconductor device according to the present embodiment, it is preferable to make the thin buried insulating film 4 as thin as possible within a range of a film thickness allowing to ignore leakage current and it is preferable to make the thin buried insulating film 4 have a film thickness of 10 nm or less, more preferably, about 2 nm which is similar to the gate insulating film 5.

In the semiconductor device according to the present embodiment, the gate insulating material is not limited to an Ni silicide film, and any material can be used as long as it has a work function positioned nearly in the center of the forbidden band of the single crystal Si thin film among a metal, a metal silicide film, or a metal nitride film of such as Ni, Co, Ti, W, Ta, Mo, Cr, Al, Pt, Pa and Ru.

INDUSTRIAL APPLICABILITY

The present invention relates to an MISFET having a stacked structure of semiconductor/insulating film/metal, and more specifically, it is applicable to a semiconductor device in which an MISFET is formed on a substrate having an SOI structure and a manufacturing industry of manufacturing the same.

The invention claimed is:

1. A method of manufacturing a semiconductor device, comprising:
    (a) preparing a semiconductor substrate having a first region and a second region, a first silicon oxide layer and a first silicon layer;
    (b) removing the first silicon oxide layer formed over the second region and the first silicon layer formed over the second region, such that the first silicon oxide layer of the first region remains on the semiconductor substrate of the first region and the first silicon layer of the first region remains on the first silicon oxide layer of the first region;
    (c) forming a first well region of a first conductive type in the semiconductor substrate of the first region;
    (d) forming a second well region of the first conductive type in the semiconductor substrate of the second region;
    (e) forming a first gate insulating film over the first silicon layer;
    (f) forming a second gate insulating film over the semiconductor substrate of the second region;
    (g) forming a first gate electrode over the first gate insulating film;
    (h) forming a second gate electrode over the second gate insulating film;
    (i) after the steps (g) and (h), forming first impurity regions of a second conductive type opposite to the first conductive type in the first silicon layer;
    (j) after the steps (g) and (h), forming second impurity regions of the second conductive type in the semiconductor substrate of the second region;
    (k) after the steps (i) and (j), forming first side wall insulating films over side surfaces of the first gate electrode;
    (l) after the steps (i) and (j), forming second side wall insulating films over side surfaces of the second gate electrode;
    (m) after the steps (k) and (l), forming third impurity regions of the second conductive type in the first well region; and
    (n) after the steps (k) and (l), forming fourth impurity regions of the second conductive type in the second well region,
    wherein the steps (c) and (d) are performed at the same time,
    wherein the steps (g) and (h) are performed at the same time,
    wherein the steps (i) and (j) are performed at the same time,
    wherein the steps (k) and (l) are performed at the same time, and
    wherein the steps (m) and (n) are performed at the same time.

2. The method of manufacturing a semiconductor device according to claim 1, further comprising:
    (o) after the steps (i) and (j), forming second silicon layers over the first source region, over the first drain region, over the second source region, and over the second drain region by an epitaxial method.

3. The method of manufacturing a semiconductor device according to claim 2, further comprising:
    (p) after the step (o), forming metal films over the second silicon layers, and
    (q) after the step (p), forming silicide layers by reacting the metal films and the second silicon layers.

4. The method of manufacturing a semiconductor device according to claim 3,
    wherein at the step (p), the metal films are formed over the first and second gate electrodes, and
    wherein after the step (q), the first and second gate electrodes include the silicide layers.

5. The method of manufacturing a semiconductor device according to claim 3,
    wherein each of the metal films includes one of Ni, Co, Ti, W, Ta, Mo, Cr, Al, Pt, Pa, and Ru.

6. The method of manufacturing a semiconductor device according to claim 1,
    wherein the steps (e) and (f) are performed at the same time.

7. The method of manufacturing a semiconductor device according to claim 1,
    wherein the first conductive type is an n-type; and
    wherein the second conductive type is a p-type.

8. The method of manufacturing a semiconductor device according to claim 1,
    wherein the first conductive type is a p-type; and
    wherein the second conductive type is an n-type.

* * * * *